United States Patent [19]
Vogley et al.

[11] Patent Number: 5,982,694
[45] Date of Patent: Nov. 9, 1999

[54] HIGH SPEED MEMORY ARRANGED FOR OPERATING SYNCHRONOUSLY WITH A MICROPROCESSOR

[75] Inventors: Wilbur Christian Vogley, Missouri City; Anthony Michael Balistreri, Houston; Karl M. Guttag, Missouri City; Steven D. Krueger, Houston; Duy-Loan T. Le; Joseph H. Neal, both of Sugarland; Kenneth A. Poteet, Houston; Joseph P. Hartigan, Stafford; Roger D. Norwood, Houston, all of Tex.

[73] Assignee: Texas Instruments Incorporated, Dallas, Tex.

[21] Appl. No.: 08/747,120

[22] Filed: Nov. 8, 1996

Related U.S. Application Data

[63] Continuation of application No. 08/327,540, Oct. 21, 1994, Pat. No. 5,587,954.

[51] Int. Cl.⁶ ..................................................... G11C 13/00
[52] U.S. Cl. ............................................. 365/221; 365/233
[58] Field of Search ....................... 365/189.01, 189.04, 365/189.05, 189.08, 221, 233, 230.01, 230.03, 230.09

[56] References Cited

U.S. PATENT DOCUMENTS

| | | | |
|---|---|---|---|
| 4,281,401 | 7/1981 | Redwine et al. | 365/222 |
| 4,618,947 | 10/1986 | Tran et al. | 365/230 |
| 4,649,511 | 3/1987 | Gdula | 364/900 |
| 4,680,738 | 7/1987 | Tam | 365/239 |
| 5,077,693 | 12/1991 | Hardee et al. | 365/230.08 |
| 5,083,296 | 1/1992 | Hara et al. | 365/230.02 |
| 5,093,807 | 3/1992 | Hashimoto et al. | 365/230.09 |
| 5,126,975 | 6/1992 | Handy et al. | 365/230.01 |
| 5,179,670 | 1/1993 | Farmwald et al. | 395/325 |
| 5,226,011 | 7/1993 | Yanagisawa | 365/189.05 |
| 5,243,703 | 9/1993 | Farmwald et al. | 395/325 |
| 5,280,594 | 1/1994 | Young et al. | 395/425 |
| 5,319,759 | 6/1994 | Chan | 395/400 |
| 5,325,337 | 6/1994 | Buttar | 365/189.08 |
| 5,400,288 | 3/1995 | Hashimoto et al. | 365/221 |

FOREIGN PATENT DOCUMENTS

| | | |
|---|---|---|
| 59-56276 | 3/1984 | Japan . |
| 59-231791 | 12/1984 | Japan . |
| 0 327 463 B1 | 8/1989 | Japan . |

OTHER PUBLICATIONS

M. Hashimoto et al., Proc. IEEE, vol. 23, No. 2, Apr. 1988, pp. 490–499.

Gallant, John, Special–feature SRAMs, EDN, Jun. 20, 1991, pp. 104–112/.

Weber, Samuel, Specialty SRAMs Are Filing the Speed Gap, Electronics, May 1990, pp. 85–87.

T. Mori et al, "55 nsec, 1.3 Mb Video Memory With Rectangular Access for Graphic Systems", Electronic Information Communication Institute Technological Research Report, vol. 89, No. 69, DRAM 20 Proceeding Technology, pp. 49–54 (4740), ICD 89 26–40, Jun. 2, 1989, EIC Electronic Information Communication Institute Cooperated.

Reese, Ed and Eddy Huang, A Sub 10nS Cache SRAM for High Performance 32 Bit Microprocessors, IEEE, 1990 Cust. IC Confr., pp. 24.2.1–24.2.4.

(List continued on next page.)

*Primary Examiner*—Terrell W. Fears
*Attorney, Agent, or Firm*—Robert N. Rountree; Lawrence J. Bassuk; Richard L. Donaldson

[57] ABSTRACT

A synchronous random access memory is arranged to be responsive directly to a system clock signal for operating synchronously with the associated microprocessor. The synchronous random access memory is further arranged to either write-in or read out data in a synchronous burst operation or synchronous wrap operation in addition to synchronous random access operations. The synchronous random access memory device may be fabricated as a dynamic storage device or as a static storage device.

59 Claims, 12 Drawing Sheets

OTHER PUBLICATIONS

Wilson, Ron, Will the Search for the Ideal Memory Architecture Ever End?, Computer Design, Jul. 1, 1990, pp. 78–99.

Hochstedler, Charles, Self–Timed SRAMs Pace High–Speed ECL Processors, Semiconductor Memories, 1990, pp. 4–10.

Lineback, J. Robert, System Snags Shouldn't Slow the Boom in Fast Static RAMS, Electronics, Jul. 23, 1987, pp. 60–62,.

Triad Semiconductors Inc., Static RAMs have on–chip address and Data Latches for Pipelining, EDN, Dec. 8, 1988, p. 116.

Cole, Bernard C., Motorola's Radical SRAM Design Speeds Systems 40%, Electronics, Jul. 23, 1987, pp. 66–68.

Iqbal, Mohammad Shakaib, Internally Timed RAMs Build Fast Writable Control Stores, Electronic Design, Aug. 25, 1988, pp. 93–96.

Leibson, Steven SRAMs' On–Chip Address and Data Latches Boost Throughput in Pipelined Systems, EDN, Oct. 13, 1988, pp. 102–103.

M. Hashimoto, et al., Proc. IEEE, Custom IC Confr., May 4–7, 1987, pp. 315–318.

TABLE I

| INITIAL INPUT ADDRESS | | | OUTPUT ADDRESS SEQUENCE | |
|---|---|---|---|---|
| \multicolumn{3}{|c|}{WRAP LENGTH WL=0} | | |
| A2 | A1 | A0 | WRAP TYPE WT=0 | WRAP TYPE WT=1 |
| 0 | 0 | 0 | 0,1,2,3,4,5,6,7 | 0,1,2,3,4,5,6,7 |
| 0 | 0 | 1 | 1,2,3,4,5,6,7,0 | 1,0,3,2,5,4,7,6 |
| 0 | 1 | 0 | 2,3,4,5,6,7,0,1 | 2,3,0,1,6,7,4,5 |
| 0 | 1 | 1 | 3,4,5,6,7,0,1,2 | 3,2,1,0,7,6,5,4 |
| 1 | 0 | 0 | 4,5,6,7,0,1,2,3 | 4,5,6,7,0,1,2,3 |
| 1 | 0 | 1 | 5,6,7,0,1,2,3,4 | 5,4,7,6,1,0,3,2 |
| 1 | 1 | 0 | 6,7,0,1,2,3,4,5 | 6,7,4,5,2,3,0,1 |
| 1 | 1 | 1 | 7,0,1,2,3,4,5,6 | 7,6,5,4,3,2,1,0 |

TABLE II

| WRAP LENGTH WL=1 | | | |
|---|---|---|---|
| INITIAL INPUT ADDRESS | | OUTPUT ADDRESS SEQUENCE | |
| A1 | A0 | WRAP TYPE WT=0 | WRAP TYPE WT=1 |
| 0 | 0 | 0,1,2,3 | 0,1,2,3 |
| 0 | 1 | 1,2,3,0 | 1,0,3,2 |
| 1 | 0 | 2,3,0,1 | 2,3,0,1 |
| 1 | 1 | 3,0,1,2 | 3,2,1,0 |

HIGH SPEED MEMORY ARRANGED FOR OPERATING SYNCHRONOUSLY WITH A MICROPROCESSOR

This is a continuation of application Ser. No. 08/327,540, filed Oct. 21, 1994, U.S. Pat. No. 5,587,954.

BACKGROUND OF THE INVENTION

This invention relates to random access memory (RAM) arranged for operating in a data processing system.

In the past, semiconductor random access memory operated faster than the associated microprocessor. During the late 1970's and early 1980's, the microcomputer market was in the early stages of development. At that time, a microcomputer system included a microprocessor and a dynamic random access memory. In a microcomputer arrangement, the microprocessor ran synchronously in response to a clock signal, but the dynamic random access memory ran asynchronously with respect to the operation of the microprocessor. The microprocessor clock was applied to a controller circuit that was interposed between the microprocessor and the dynamic random access memory. In response to the microprocessor clock signal, the controller derived other control or clock signals which ran the dynamic random access memory operation.

Typical operating speeds of the microprocessor and the dynamic random access memory were different from each other. A microprocessor cycle time was in a range of 400–500 nanoseconds while a dynamic random access memory cycle time was approximately 300 nanoseconds. Thus the dynamic random access memory was able to operate faster than its associated microprocessor. The memory completed all of its tasks with time to spare. As a result, the microprocessor operated at its optimum speed without waiting for the memory to write-in data or read out data.

Subsequently, as the semiconductor art developed, the operating speeds of microprocessors and memory devices have increased. Microprocessor speeds, however, have increased faster than dynamic random access memory speeds. Now microprocessors operate faster than their associated dynamic random access memory. For instance, a microprocessor cycle time is approximately 40 nanoseconds and a dynamic random access memory cycle time is approximately 120 nanoseconds. The microprocessor completes all of its tasks but must wait significant periods of time for the dynamic random access memory.

Having the microprocessor waiting for the memory is a problem that has been attracting the attention of many microcomputer designers. High speed static cache memories have been added to the microcomputer systems to speed up access to data stored in the memory. A significant part of the problem is to speed up access to data in the memory without significantly increasing the cost of the microcomputer system. Cache memory, however, is significantly more expensive than dynamic random access memory.

An existing problem with dynamic random access memory devices is that they require a substantial amount of peripheral circuitry between the microprocessor and the memory for generating several control signals. So many interdependent control signals are generated by long logic chains within the peripheral circuitry that microcomputer systems designers must resolve very complex timing problems. The delay caused by the timing problems and the fact that memories now are accessed slower than the associated microprocessor cause problems of excessive time delays in microcomputer system operations.

SUMMARY OF TEE INVENTION

These and other problems are solved by a random access memory which is arranged to be responsive directly to a system clock signal for operating synchronously with the associated digital processor. The synchronous random access memory is further arranged to write-in or read out data in either a synchronous burst mode or a synchronous wrap mode in addition to synchronous random access operations. Such a synchronous random access memory device may be fabricated as a dynamic or as a static storage device.

Control signals from the digital processor are used for controlling various memory operations. As an alternative, the digital processor may process a clock signal that is used as the system clock for operating both the digital processor and the synchronous random access memory. The digital processor may be a microprocessor.

BRIEF DESCRIPTION OF THE DRAWING

A better understanding of the invention may be derived by reading the following detailed description with reference to the drawing wherein.

DETAILED DESCRIPTION

Figure 1:
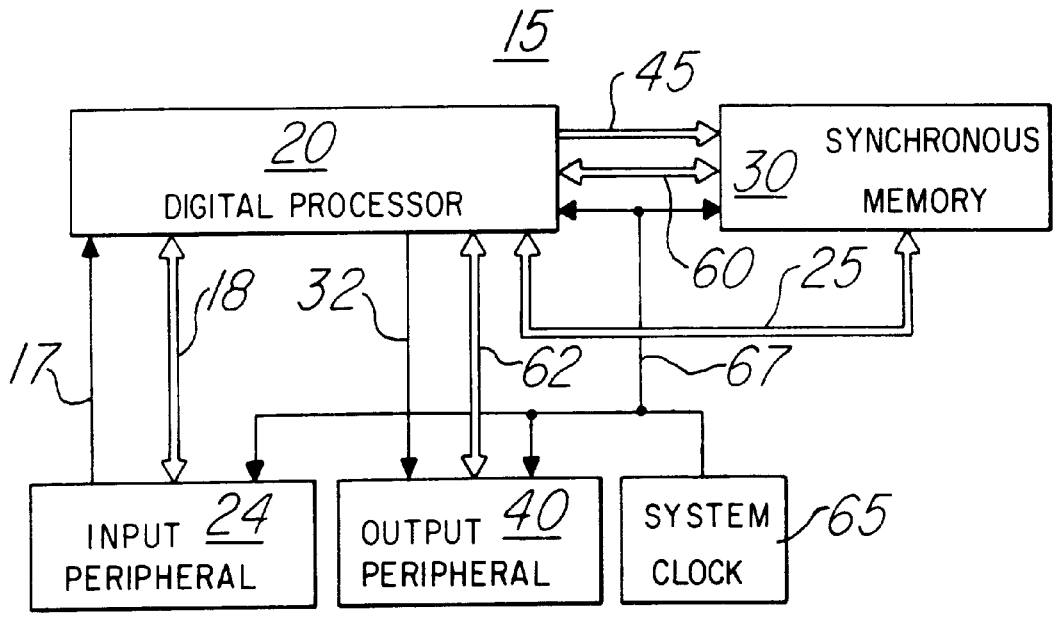
FIG. 1 is a block diagram of a data processing system including a synchronous random access memory.

Referring now to FIG. 1, a data processing system 15 includes a digital processor 20 which receives digital data by way of a bus 17 from an input peripheral device 24. The digital processor 20 may be a microprocessor. Control signals pass between the digital processor 20 and the input peripheral device 24 by way of a control bus 18. The digital processor 20 processes that data and other data, all of which may be transmitted by way of a data bus 25 for storage in and retrieval from a synchronous memory, device 30. The digital processor 20 also sends resulting output data via an output data bus 32 to an output peripheral device 40 where the output data may be displayed or used for reading, viewing or controlling another device that is not shown. Control signals are transmitted between the digital processor 20 and the synchronous memory device 30 by way of a control bus 60. Control signals also are transmitted between the digital processor 20 and the output peripheral device 40 by way of a control bus 62. System clock signals are produced by a system clock device 65 and are applied through a clock lead 67 to the digital processor 20, the synchronous memory device 30, the input peripheral device 24, and the output peripheral device 40.

From time to time during operation of the data processing system 15, the digital processor 20 accesses the synchronous memory 30 for writing data into storage cells or for reading data from the storage cells thereof. Storage cell row and column addresses, generated by the digital processor 20, are applied through an address bus 45 to the synchronous memory 30. Data may be sent by way of the data bus 25 either from the digital processor 20 to be written into the synchronous memory 30 or to be read from the synchronous memory 30 to the digital processor 20.

Control signals, produced by the digital processor 20 and transmitted by way of the control bus 60 to the synchronous memory 30 include a row address control signal $\overline{RE}$, a column address control signal $\overline{CE}$, a write signal $\overline{WE}$, a burst signal $\overline{BT}$, a burst direction signal +/−, a wrap select signal $\overline{WP}$, a wrap-type signal WT, a wrap-length signal WL, and others. Control signals may also be transmitted from the synchronous memory 30 to the digital processor 20.

Figure 2:
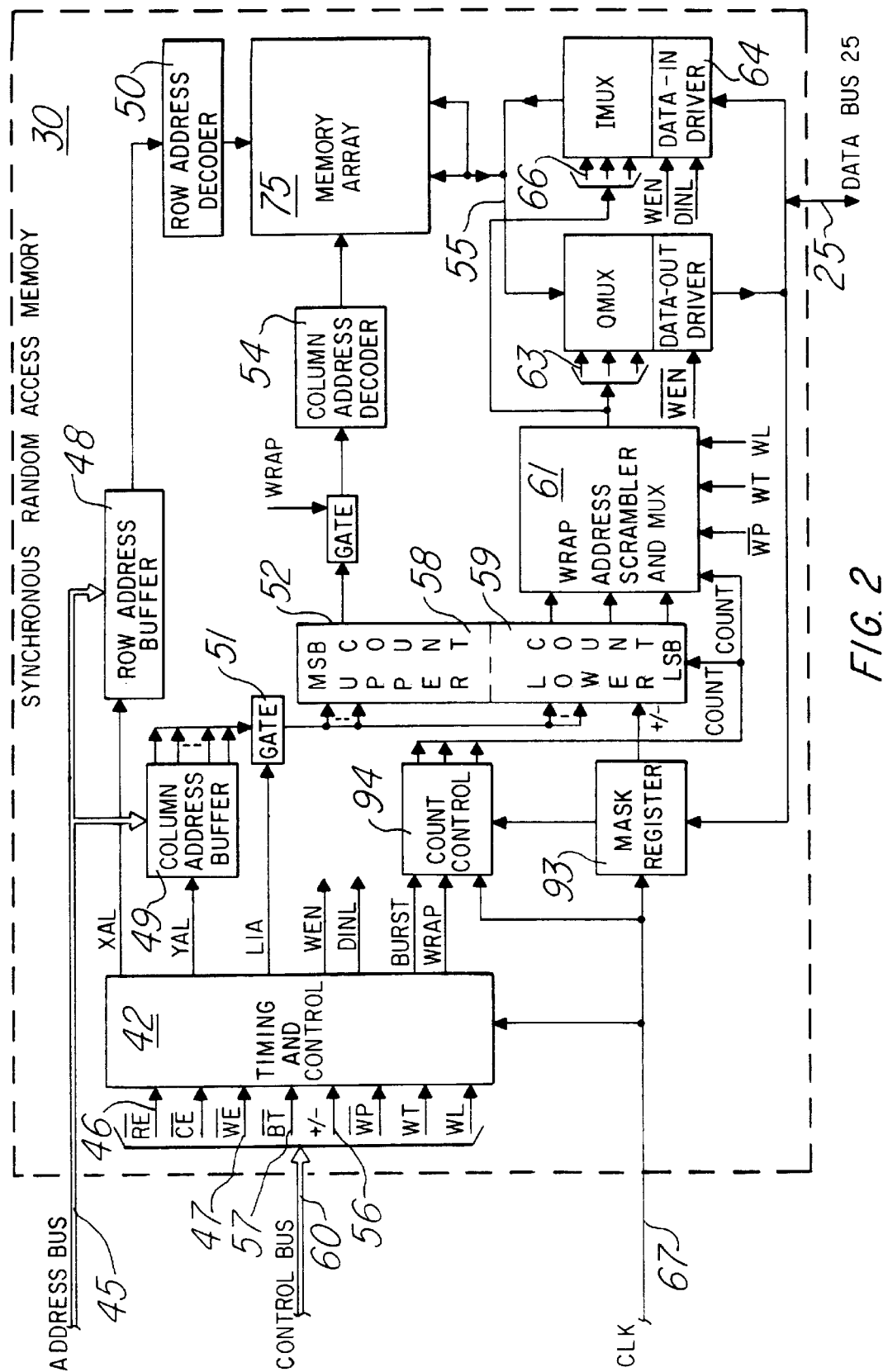
FIG. 2 is a block diagram of a synchronous random access memory.

Referring now to FIG. 2, the synchronous random access memory 30 includes a memory array 75 of metal-oxide-semiconductor (MOS) dynamic storage cells arranged in addressable rows and columns. The memory array 75 of storage cells is similar to the well known arrays of cells used in dynamic random access memory devices. Either complementary metal-oxide-semiconductor (COOS) or bipolar complementary metal-oxide-semiconductor (BICMOS) technology may be used for fabricating the memory array 75.

Several other circuit blocks are shown in FIG. 2. These other circuit blocks are designed and arranged for operating the array of storage cells synchronously with the digital processor 20 of FIG. 1 in response to the common system clock signal CLK, which may be gated by the digital processor, as discussed subsequently with respect to FIG. 20. The circuit blocks other than the array of storage cells may be fabricated as either CMOS or BICMOS circuits.

The synchronous random access memory 30 is operable for synchronous random access read or write operations, for synchronous burst read or write operations, and for synchronous wrap read or write operations. All types of synchronous operations are to be described fully hereinafter. Such descriptions are to be made in reference to timing diagrams and truth tables presented in FIGS. 3–5 and 7–17. In the timing diagrams, a DON'T CARE state is represented by cross-hatching.

Figure 3:
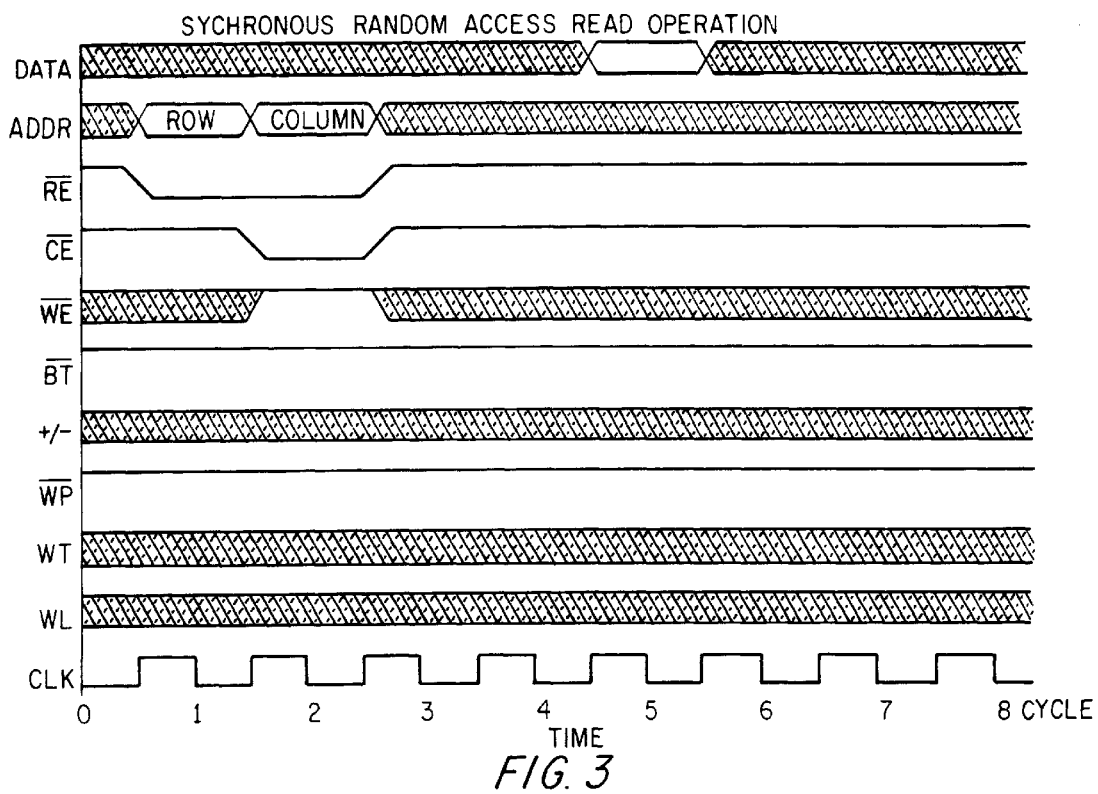
FIG. 3 is a timing diagram of a synchronous random access read operation.

Referring now to FIGS. 3 and 2 for a synchronous random access read operation, an N bit wide row address and the row address control signal $\overline{RE}$ are applied to the address bus 45 and a lead 46. Control signals, such as the signal $\overline{RE}$ and others, are active low signals. The write signal $\overline{WE}$ on a lead 47 being high, at clock cycle time 2, designates a read operation. The synchronous read operation commences at a falling edge of the system clock signal CLK at signal time 1. For this illustrative embodiment, the system clock times operations in synchronism at the negative-going edges of the clock pulses, such as at the cycle times 1, 2, 3, etc.. In other embodiments, not shown herein, the system may time operations at the positive-going edges or on both negative-going and positive-going edges of the clock pulses.

When the system clock CLK has a negative-going edge while the row address is applied at the clock cycle time 1 and the row address control signal $\overline{RE}$ is low, the row address is latched into the row address buffer 48.

Since the illustrative embodiment has an N bit wide address bus, that bus is time shared by row addresses and column addresses. During the clock cycle time 2 following the latching of the row address into the row address buffer 48, a column address is applied to the address bus 45. While the column address control signal $\overline{CE}$ is low and the write signal $\overline{WE}$ is high at the clock cycle time 2, the system clock goes low, latching the column address into the column address buffer 49.

Concurrently with the latching of the column address into the column address buffer, the row address is being decoded through the row address decoder 50. The row address decoder 50 decodes the binary number row address into a one-out-of-$2^N$ selection. As a result of the one-out-of-$2^N$ selection, an active signal is applied to the wordline of the one selected row. This wordline remains selected throughout the remainder of the random access read operation.

At the next negative-going edge of the system clock CLK, a load initial address signal LIA enables a group of load count transfer gates 51 to move the initial column address into upper count and lower count sections of a column address counter 52. The most significant bits of the column address are latched into the upper count section 58 and the least significant bits of the column address are latched into the lower count section 59 of the column address counter 52. All of those address bits in the column address counter 52 represent the initial column address to be applied to the memory array for the read out operation. Since the operation being described is a synchronous random access operation, the initial column address is the only column address to be applied to the memory array during the read operation.

The most significant bits of the initial column address are applied from the upper count section 58 through a gate 53 to the column address decoder 54 for selecting M columns of storage cells of the memory array, from which data are to be read out. These most significant bits of the column address are decoded by the column address decoder 54 to enable a block of M columns of storage cells in the memory array 75.

Data bits are read from a group of M storage cells, determined by a part of the decoded column address, i.e., the decoded most significant bits of the column address. These M data bits are transferred in parallel from the memory array 75 through a group of leads 55 to an output multiplexer OMUX where they are latched for output.

A one-out-of-M selection is made by the output multiplexer OMUX in response to control signals applied to the output multiplexer from the lower count section 59 of the column address counter 52. The least significant bits of the initial column address, residing in the lower count section 59, determine which bit latched in the output multiplexer OMUX is the one-out-of-M bit to be gated through the output multiplexer to a lead in the data bus 25.

Figure 4:
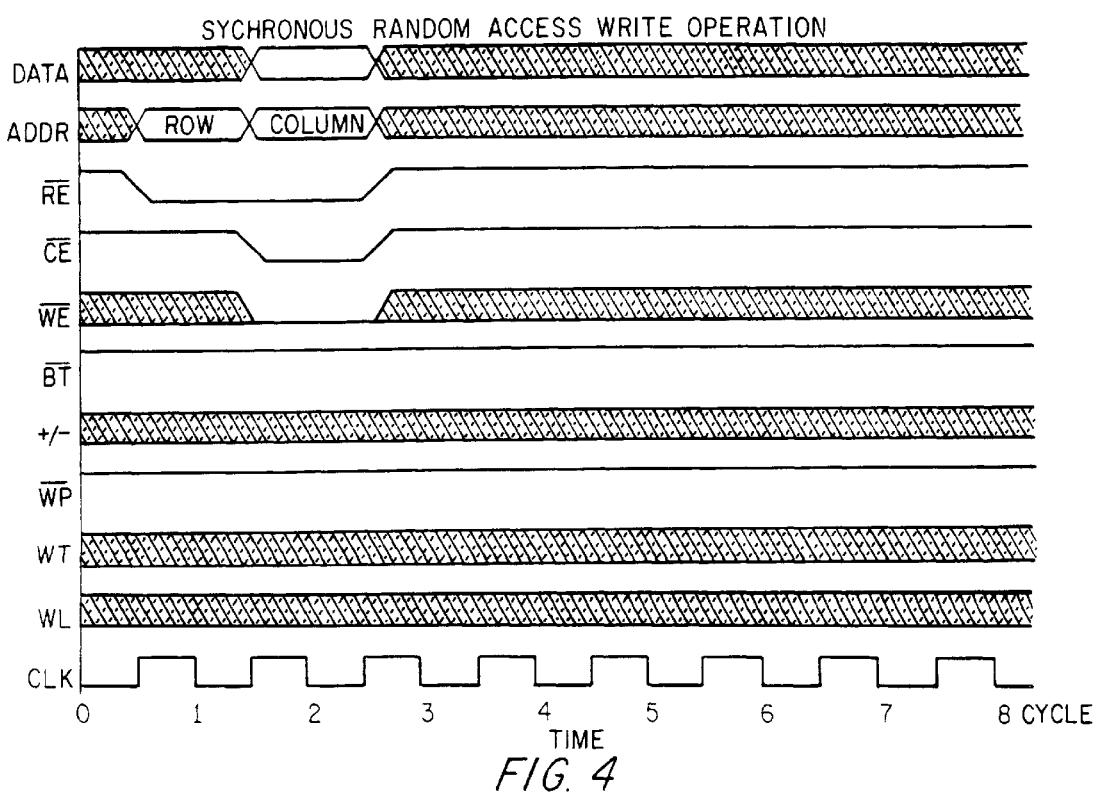
FIG. 4 is a timing diagram of a synchronous random access write operation.

Referring now to FIGS. 4 and 2 for a synchronous random access write operation, row addressing and column addressing occur similar to the synchronous random access read operation except that the write signal $\overline{WE}$ is at a low level at the clock cycle time 2 to designate the synchronous random access write operation. The decoded row address from the row decoder 50 enables one row of storage cells in the memory array 75. The most significant bits of the column address, decoded by the column decoder 54, enable a block of M column leads in the array. The selected set of storage cells at the addressed intersections of the addressed row and the set of M addressed columns are enabled to receive the data that is to be written. The least significant bits of the column address (residing in the lower count section 59 of the column address counter 52) determine control signals that are applied to the input multiplexer IMUX for determining which one-out-of-M bit on the data bus 25 is transmitted through the input multiplexer IMUX to be written into the memory array 75. The one-out-of-M bit is applied to the associated column lead of the selected block of columns of storage cells in the memory array 75. That bit of data is written into the storage cell at the address selected by the row address and the initial column address. The other M−1 bits of data, related to the selected set of M columns, are not written into the memory array 75 because the input multiplexer IMUX does not transmit those M−1 bits to the associated column lines of the memory array 75.

The next subsequent operation of the memory array following either the synchronous read operation or the synchronous write operation may be another synchronous random access operation, i.e., either a synchronous read operation or a synchronous write operation. The same row and column addresses or a different row or column address can be used to select the storage cell for the next access. A synchronous burst or a synchronous wrap operation also may follow the synchronous random access read or write operations.

In the foregoing discussion of the synchronous read and write operations, the illustrative embodiment includes an N bit wide address bus 45 that is time-shared by row and column addresses. In another useful embodiment, not shown, the address bus may be wide enough so that both the row and column addresses are applied concurrently in parallel. As a result, both addresses are latched simultaneously into their respective address buffers, i.e., row address buffer 48 and column address buffer 49. Otherwise the synchronous random access read and write operations proceed, as previously described.

It is noted that for the synchronous random access write operations, the row and column addresses may be latched either before data is latched or at the same time.

In addition to the synchronous random access read and write operations, the embodiment of FIGS. 1 and 2 can perform a synchronous burst read operation and a synchronous burst write operation.

In the synchronous burst read operation, a group of bits is read rapidly from a sequence of column addresses along a common row of storage cells in the memory array 75. The sequence of addresses can be either in an ascending order of column addresses (UP) or in a descending order of column addresses (DOWN). The direction, or polarity, of the sequence of column addresses is determined by a burst direction signal +/− on a lead 56. The length of the burst, i.e., the number of bits in the burst, is determined by the duration of the low burst select signal $\overline{BT}$ that is applied, on a lead 57, by the digital processor 20 of FIG. 1. When the burst select signal $\overline{BT}$ goes high, the synchronous burst read operation is terminated.

Generally a synchronous burst read operation is similar to a random access read operation. There are some differences that will become apparent in the subsequent description of the synchronous burst read operation. Similar aspects of the operations are described minimally so that differences can be fully described without excessive redundant description.

Figure 5:
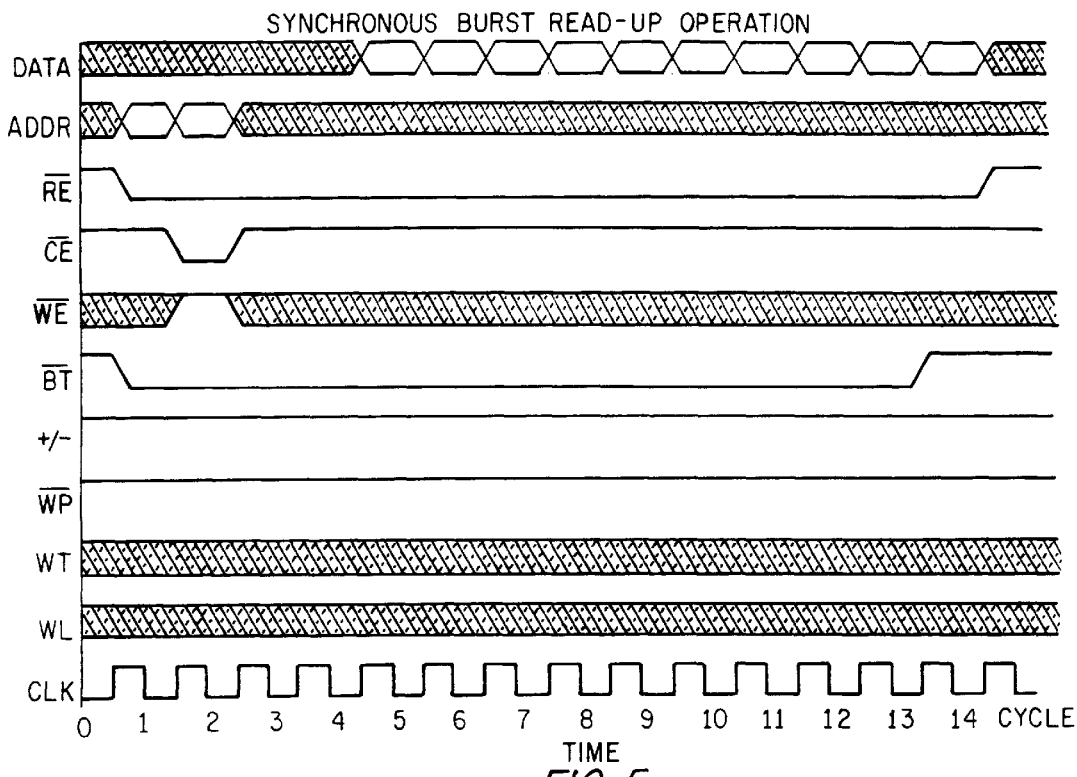
FIG. 5 is a timing diagram of a synchronous burst read-up operation.

Referring now to FIG. 5, there is shown a timing diagram for a synchronous burst read-up operation of the synchronous memory device 30 of FIG. 2. The row address control signal $\overline{RE}$ and the burst select signal $\overline{BT}$ go active low at clock cycle time 1 to commence the operation. The burst direction signal +/− is at a high level to indicate that the sequence of column addresses is an incremented sequence. A row address is latched into the row address buffer 48 at clock cycle time 1. An initial column address is latched into the column address buffer 49 at clock cycle time 2. The write signal $\overline{WE}$ is at a high level to indicate the read operation. The row address is decoded by the row address decoder 50 to select a row of storage cells in the memory array 75. In response to the load initial address signal LIA, the most significant bits of the initial column address are gated through gates 51 into the upper count section 58 of the column address counter 25 while the least significant bits of the same address are gated into the lower count section 59 of the column address counter 52. The most significant bits are decoded in the column address decoder 54 to select two blocks of M columns for read out from the memory array 75. One of those columns is selected for transmitting its bit through the output multiplexer OMUX as the initial bit of the desired sequence of bits on the data bus 25.

Figure 6:
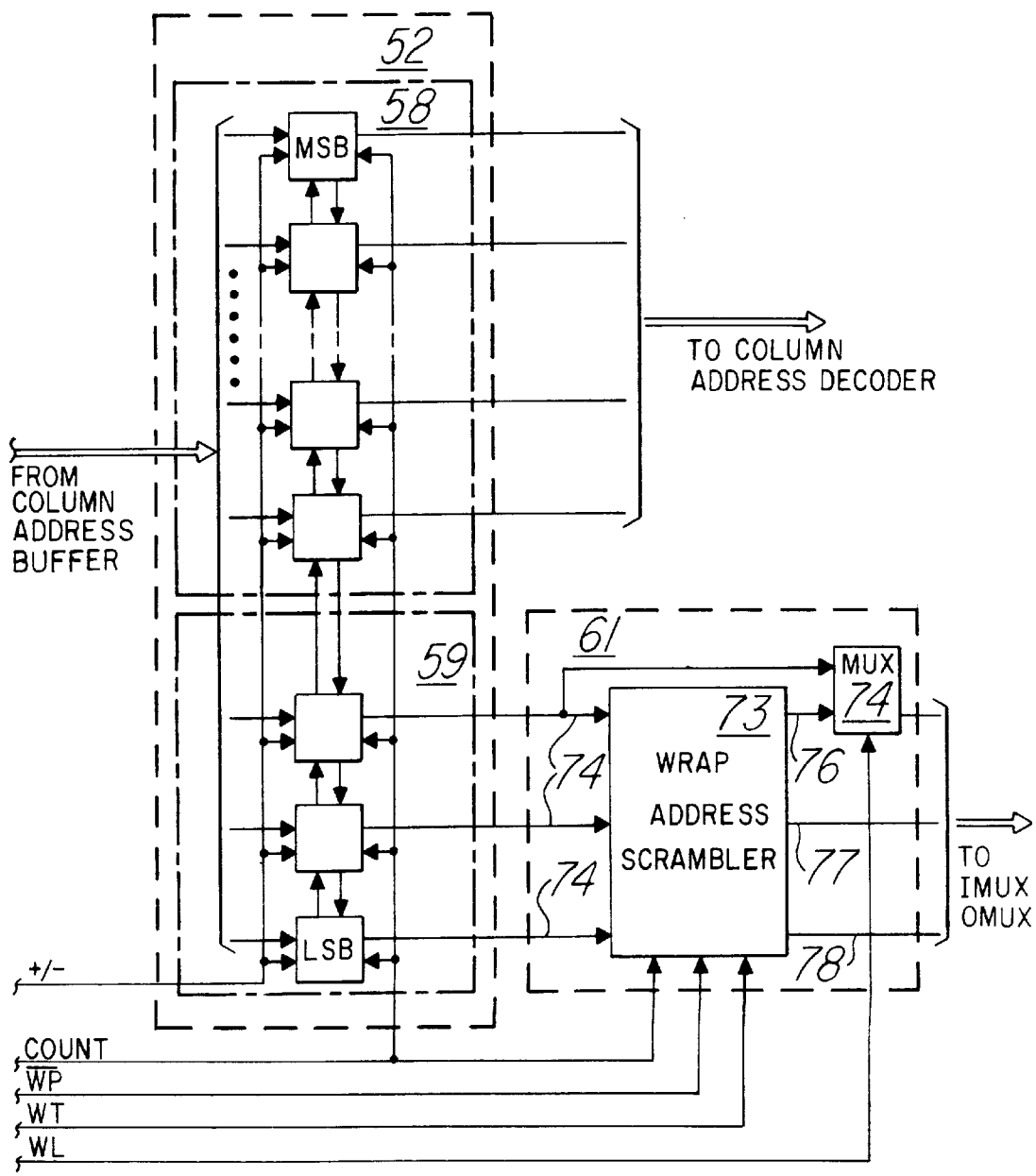
FIG. 6 is a block diagram of a column address counter and the wrap address scrambler.

Referring now to FIG. 6, there is a detailed block diagram of the upper count section 58 and the lower count section 59 of the column address counter 52. After the initial address is decoded, the upper count and lower count sections of, the column address counter 52 are incremented by a count clock signal COUNT. The upper and lower counters are organized as a continuous series of binary counter stages. As shown in FIG. 2, a gate 51 is provided for transferring the initial column address into the upper count and lower count sections of the column address 52 in response to the load initial address signal LIA. The up or down direction of the column address sequence is determined by the burst direction signal +/−. A least significant bit counter stage LSB and a most significant bit counter stage MSB are indicated in FIG. 6. The upper count section 58 includes all of the counter stages except the $\log_2(2M)$ least significant bit counter stages which make up the lower count 59.

In a synchronous burst read-up operation after the initial column address is decoded, the address residing in the upper and lower count sections 58 and 59 is incremented under control of the clock signal COUNT. The next address produced in the upper and lower count sections 58 and 59 is the initial column address incremented by one. The next sequential bit is transmitted through the output multiplexer OMUX from the column of storage cells of the memory thereby addressed.

A first block of M columns and a next adjacent higher order block of M columns of storage of the memory array 75 are addressed simultaneously by the column address decoder 54. Bits are transmitted through the output multiplexer OMUX from a first one of those blocks while the bits from the second block of M columns are accessed from the memory array and are applied to the output multiplexer OMUX. When the first set of addresses is exhausted, the sequence of addresses continues through the second set of M addresses while a third set of M addresses is applied to the output multiplexer in place of the first set. By thus alternating sets of addresses in a rising order, the desired burst of bits is read out of the memory array 75. These alternating sets of addresses for selecting the desired sequence of bits enables the data to be read out through the output multiplexer OMUX to the data bus 25 in a continuous stream without having to wait for each address to be supplied from the digital processor 20 of FIG. 1. The sequential bits of data transmitted out of the output multiplexer OMUX are in a continuous stream at the rate of the system clock CLK.

In the synchronous burst mode, the number of bits of data read out of the memory array depends upon the duration of the low active burst signal $\overline{BT}$ on the lead 57. When the burst signal $\overline{BT}$ goes high, the synchronous burst read operation is terminated.

A synchronous burst read operation also can be made from memory cells having a sequence of descending column addresses in the memory array 75. There are a couple of distinctions between this synchronous burst read-down operation and the synchronous burst read-up operation which was just described.

Figure 7:
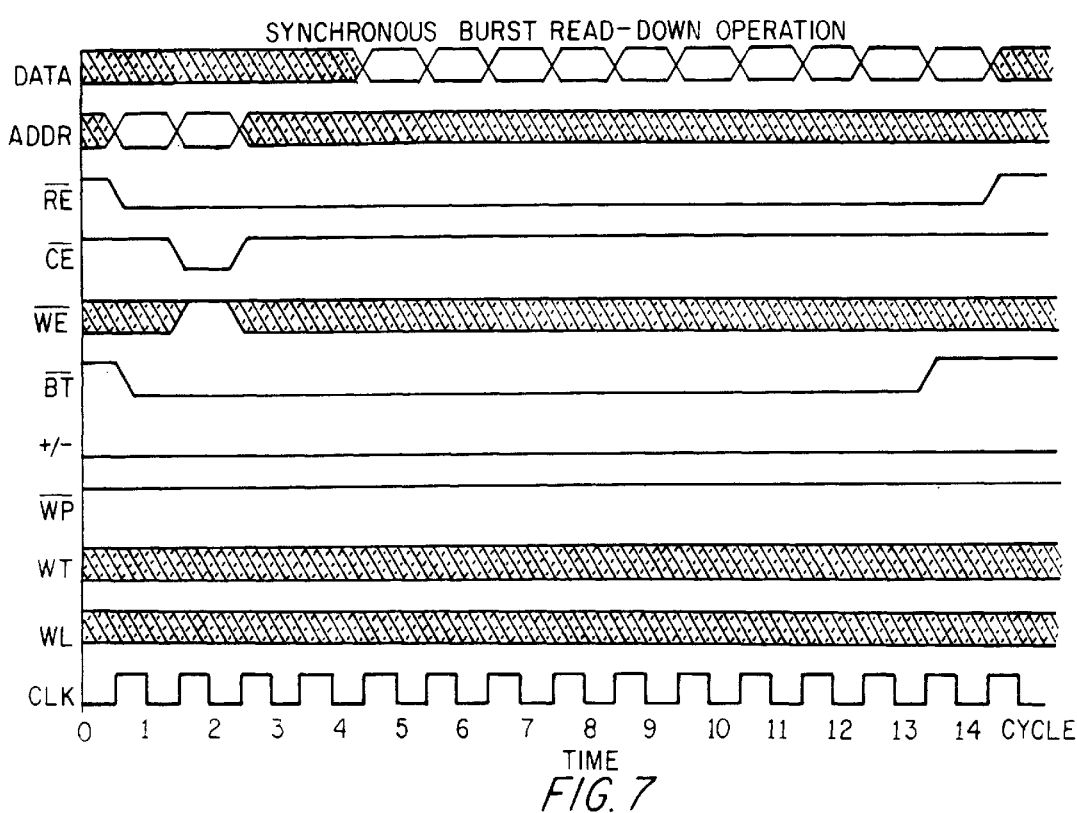
FIG. 7 is a timing diagram of a synchronous burst read-down operation.

Referring now to FIGS. 7 and 2 for a synchronous burst read-down operation, the only difference in the control signals is that the burst direction signal +/− is a low level to signify that the count in the upper and lower count sections of the column address counter 52 is decremented in response to each cycle of the counting clock COUNT. Bits from a first set of M addressable columns and from the next adjacent lower order set of M addressable columns are read from the memory array 75 and are applied to the output multiplexer OMUX. Individual bits are transmitted through the output multiplexer in response to a descending sequence of addresses applied to the output multiplexer OMUX from the lower count section 59 by way of a wrap address scrambler 61 and leads 63. In the synchronous burst operation, the wrap address scrambler allows the address from the lower count section 59 to be transmitted without change to the multiplexer. Since the count in the column address counter is being decremented in response to the clock signal COUNT, the sequence of bits transmitted out through the output multiplexer OMUX is read from columns having a sequence of descending addresses in the memory array 75.

Blocks of M column addresses are selected by the count in the upper count section 58 of the column address counter 52. Bits from alternate ones of those sets of column addresses are selected by the addresses of the individual columns, as determined by the count in the lower count section 59 of the column address counter 52.

Figure 8:
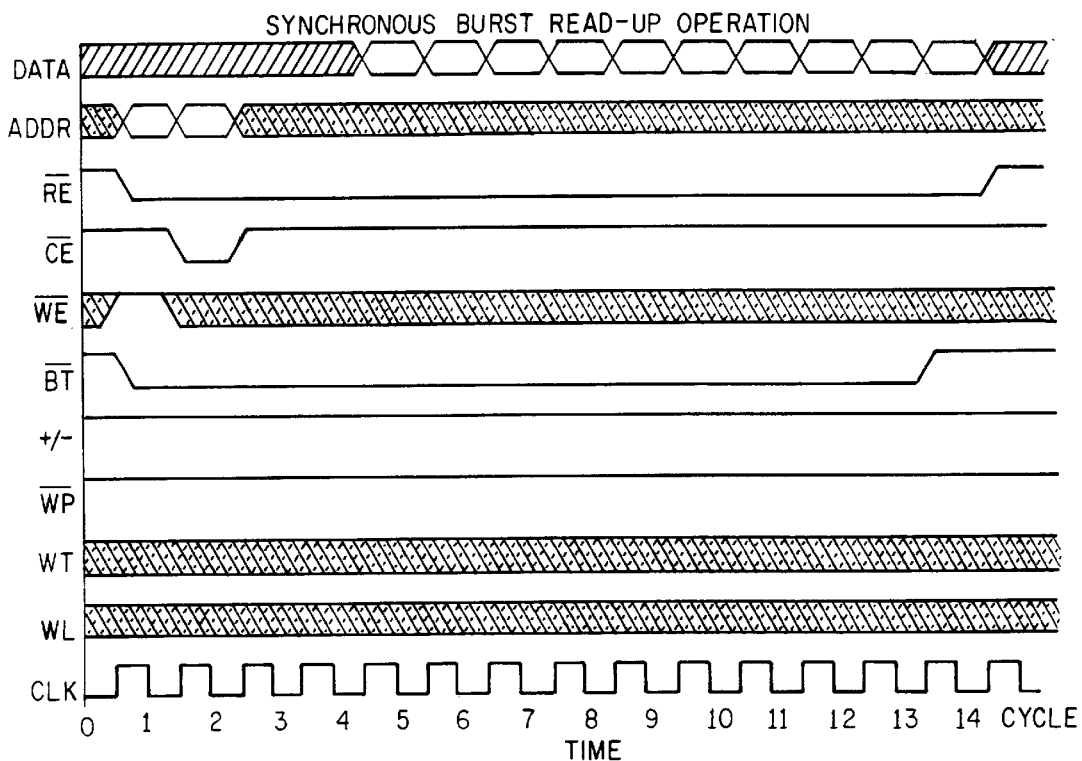
FIG. 8 is a timing diagram of another synchronous burst read-up operation.
Figure 9:
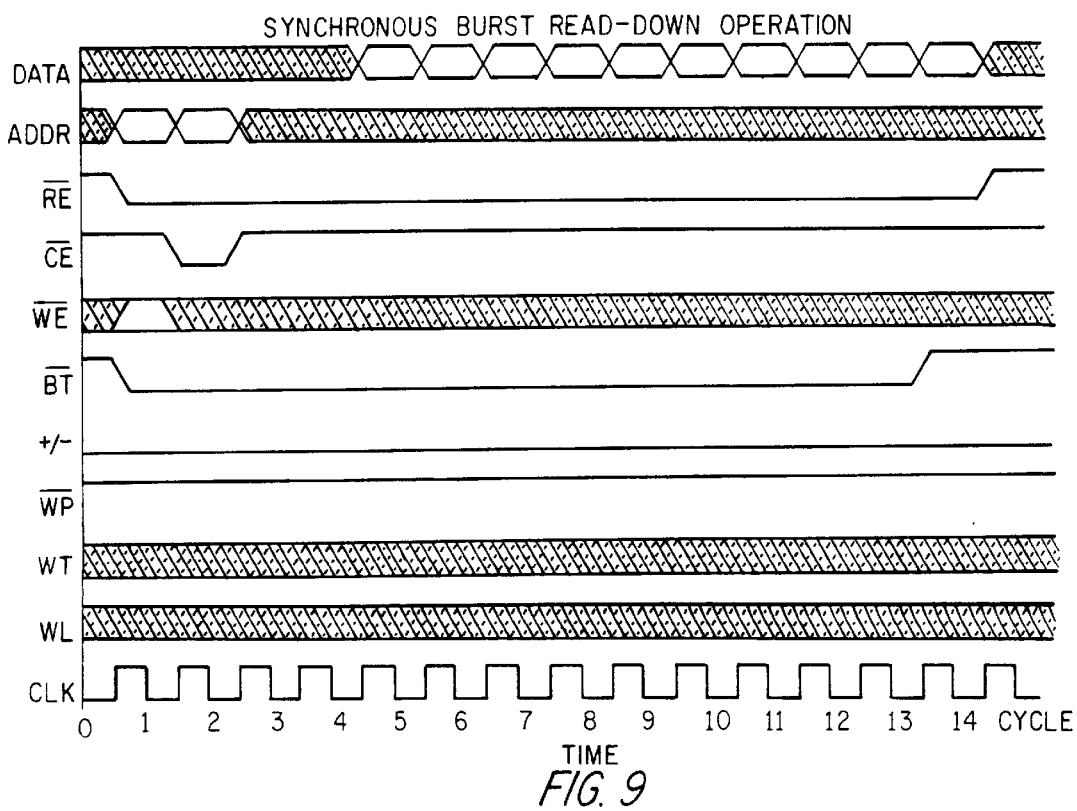
FIG. 9 is a timing diagram of another synchronous burst read-down operation.

FIGS. 8 and 9, respectively, are alternative timing diagrams for synchronous burst read-up and synchronous burst read-down operations of the synchronous random access memory 30 of FIG. 2. The difference in the timing diagrams of FIGS. 8 and 9 with respect to the diagrams of FIGS. 5 and 7 is that the write signal WE is sampled at the clock cycle time I instead of at the clock cycle time 2. Either timing is acceptable for adequate operation of the synchronous random access memory 30.

The just described synchronous burst read operations (either read-up or read-down) provide the data processing system of FIG. 1 with a capability to read out of a row of the memory array 75 an entire sequence of data bits (a burst) at a rate of one bit per cycle of the system clock CLK for the active duration of the burst signal $\overline{BT}$. A single row address and only the initial column address are forwarded from the digital processor 20 to the synchronous random access memory 30. The rest of the sequence of column addresses is produced by the column address counter 52 at the rate of a new address for every cycle of the system clock CLK.

Another important operation of the data processing system 15 is a synchronous burst write operation, which enables the digital processor 20 of FIG. 1 to apply a sequence of data bits onto the data bus 25 in consecutive system time slots with a row address and only an initial column address to determine where they are to be stored in the synchronous random access memory 30. The upper and lower count sections 58 and 59 determine a sequence of column addresses following the initial column address. The sequence of data bits on the data bus 25 is stored in the addressed storage cells of the memory array 75 in synchronism with system clock cycles.

Figure 10:
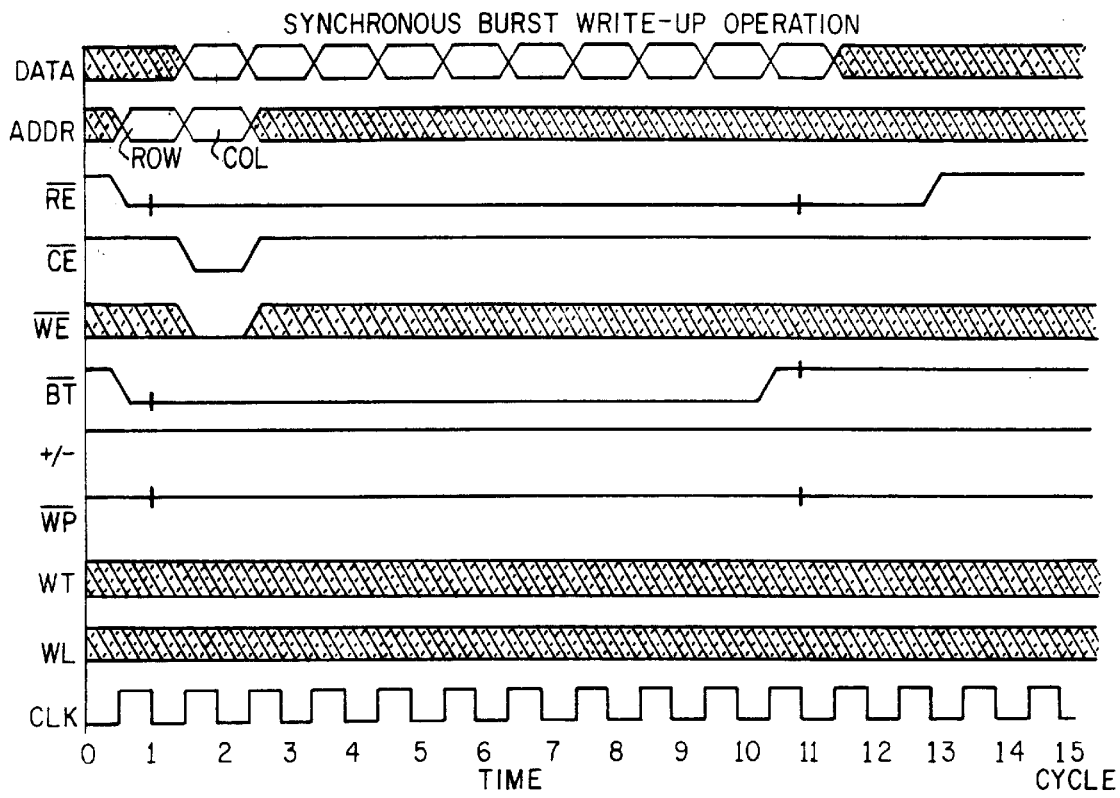
FIG. 10 is a timing diagram of a synchronous burst write-up operation.

Referring now to FIG. 10, there is shown a timing diagram of a synchronous burst write-up operation for storing the sequence of data bits into the memory array 75 of FIG. 2. In such an operation, data bits are stored in storage cells having the same row address and sequential column addresses in ascending order.

As shown in FIG. 10, the write signal $\overline{WE}$ and the burst signal $\overline{BT}$ are low, and the wrap signal $\overline{WP}$ is held high. Since this is a synchronous burst write-up operation, the burst direction signal +/− is high to produce an ascending sequence of column addresses. Because the row address control signal $\overline{RE}$ is low, the timing and control circuit of FIG. 2 produces the row address latch signal XAL during the system clock cycle time 1. Because the column address control signal $\overline{CE}$ is low during clock cycle 2, the timing and control circuit produces the column address latch signal YAL during the system clock cycle time 2. The row address and the initial column address are latched into the respective row and column address buffers 48 and 49 to begin the burst write-up operation. The row address is decoded through the row decoder 50. The initial column address is transferred into the upper and lower count sections of the column address decoder 52. The most significant bits go into the upper count section 58, and the least significant bits into the lower count section 59. Advantageously a sequence of data bits, starting with the first bit on the data bus 25 during the system clock cycle time 2, is latched, one bit at a time, consecutively into an input multiplexer IMUX in synchronism with the system clock CLK. Data bits are applied through the data bus 25 to the data-in driver circuit 64. A write enable signal WEN, produced by the timing and control circuit 42, enables data from the data bus 25 to be transferred to the data-in drivers 64. A data-in latch signal DINL, also produced by the timing and control circuit 42, latches data from the data bus 25 into the data-in drivers 64. For the synchronous burst operation, the most significant bits of the initial column address, in the upper count section 58, are decoded into a selection of two blocks of M columns. Signals from lower count section 59 pass through to the output of the wrap address scrambler 61 and are applied by way of leads 66 to the control inputs of the input multiplexer IMUX for determining which one-out-of-2M bit is transmitted to the associated column of storage cells in the memory array 75. The least significant bits of the initial column address are decoded into a one-out-of-2M selection for enabling one of the bits, associated with the initial column address, to be transmitted from the data bus 25 through the input multiplexer IMUX to be stored in the memory array 75. A storage cell located at the intersection of the row address and the initial column address is the first storage location. Each subsequent cycle of the system clock causes the binary count in the combination of the upper and lower count sections of the column address counter 52 to be incremented. The following data bits, selected from the data bus 25 in synchronism with the system clock, are each stored in the sequence in a separate one of the storage cells along the accessed row in the memory array 75. In response to the clock signal COUNT, the count in the lower count and upper count sections of the column address counter 52 is incremented (because the burst direction signal +/− is high) for directing the following data bits from the data bus 25 into sequentially addressed columns of storage cells of the memory array 75. The burst of data bits and the generation of the ascending sequence of addresses continues until the burst select signal $\overline{BT}$ returns to the high level.

Figure 11:
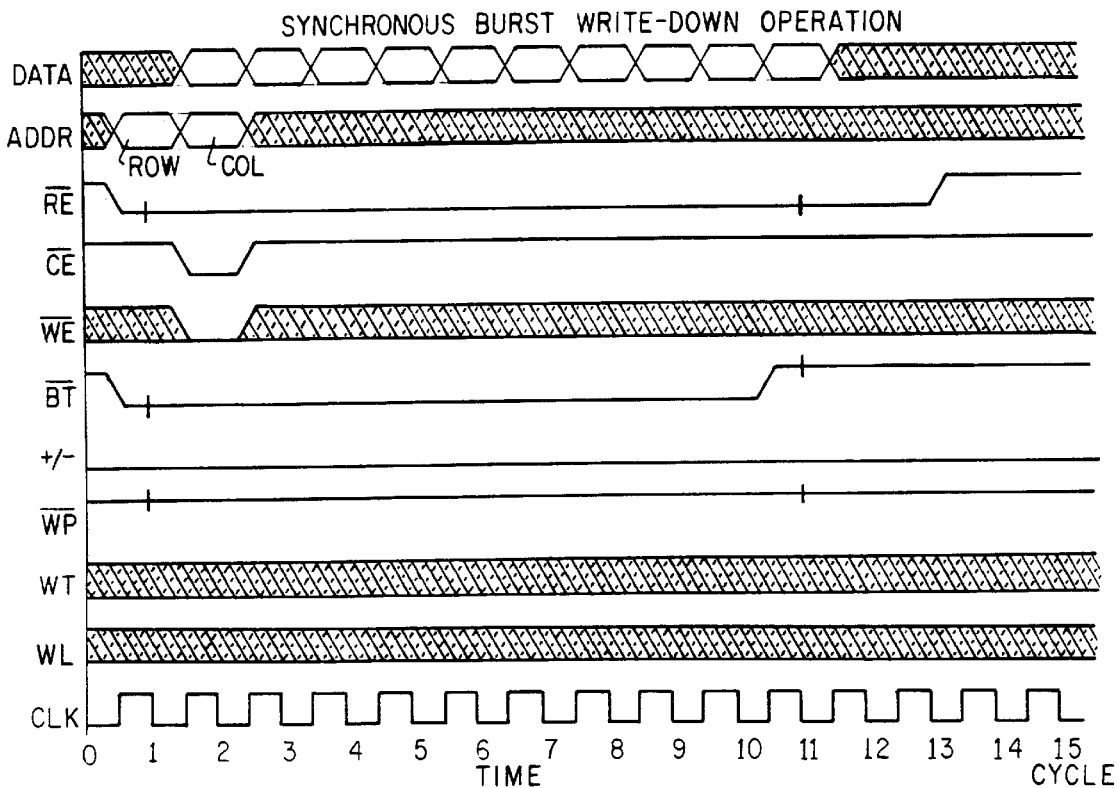
FIG. 11 is a timing diagram of a synchronous burst write-down operation.

Referring now to FIG. 11, there is shown a timing diagram for a synchronous burst write-down operation to store data bits into the memory array 75 of FIG. 2. This operation is similar to the just described synchronous burst write-up operation. Because the row address control signal $\overline{RE}$ is low, the timing and control circuit 42 of FIG. 2 produces the row address latch signal XAL and latches the row address during the system clock cycle time 1. Because the column address control signal $\overline{CE}$ is low during system clock cycle time 2, the timing and control circuit 42 produces the column address latch signal YAL and latches the initial column address during that system clock cycle.

Different, however, than the previously described synchronous burst write-up operation, the burst direction signal +/− is low causing the upper and lower count sections of the column address counter 52 to decrement the address, residing therein, in response to every cycle of the system clock CLK. Thus the sequence of column addresses starts with the initial column address and decreases in sequential order for each subsequent system clock cycle. Data bits from the data bus 25 are directed through the input multiplexer IMUX to be written into storage cells located along a row at columns having sequentially decreasing addresses in the memory array 75.

Figure 12:
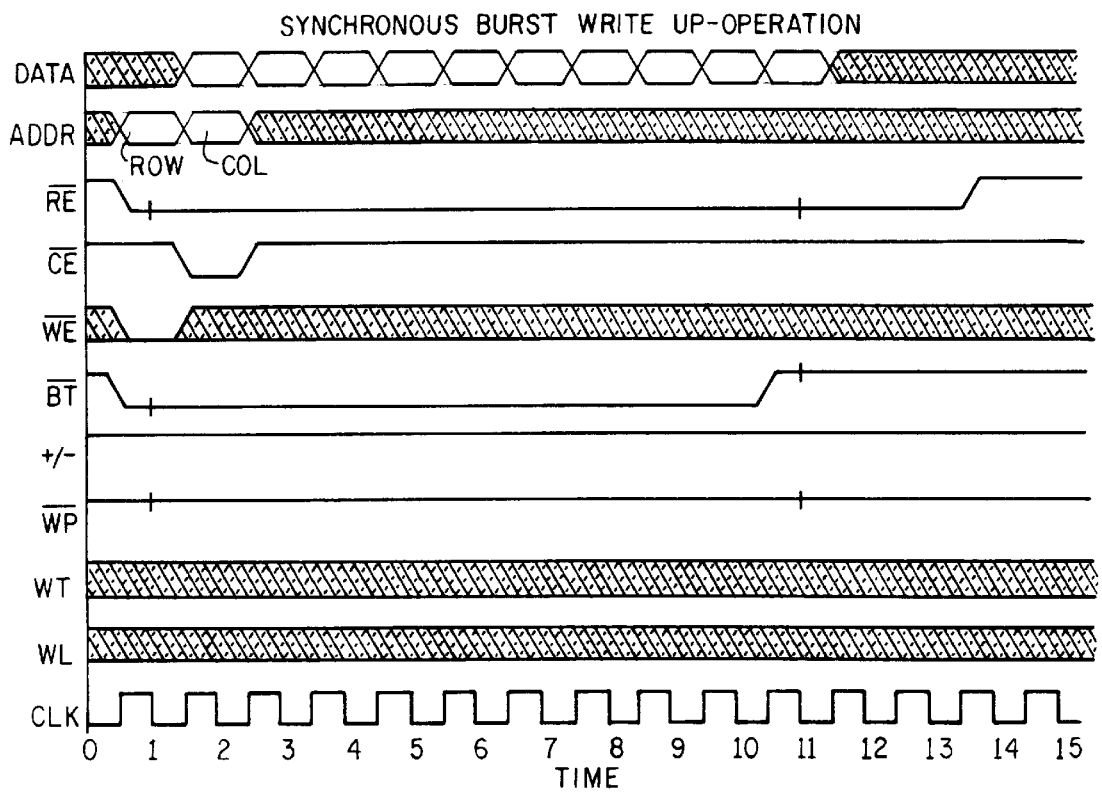
FIG. 12 is a timing diagram of another synchronous burst write-up operation.
Figure 13:
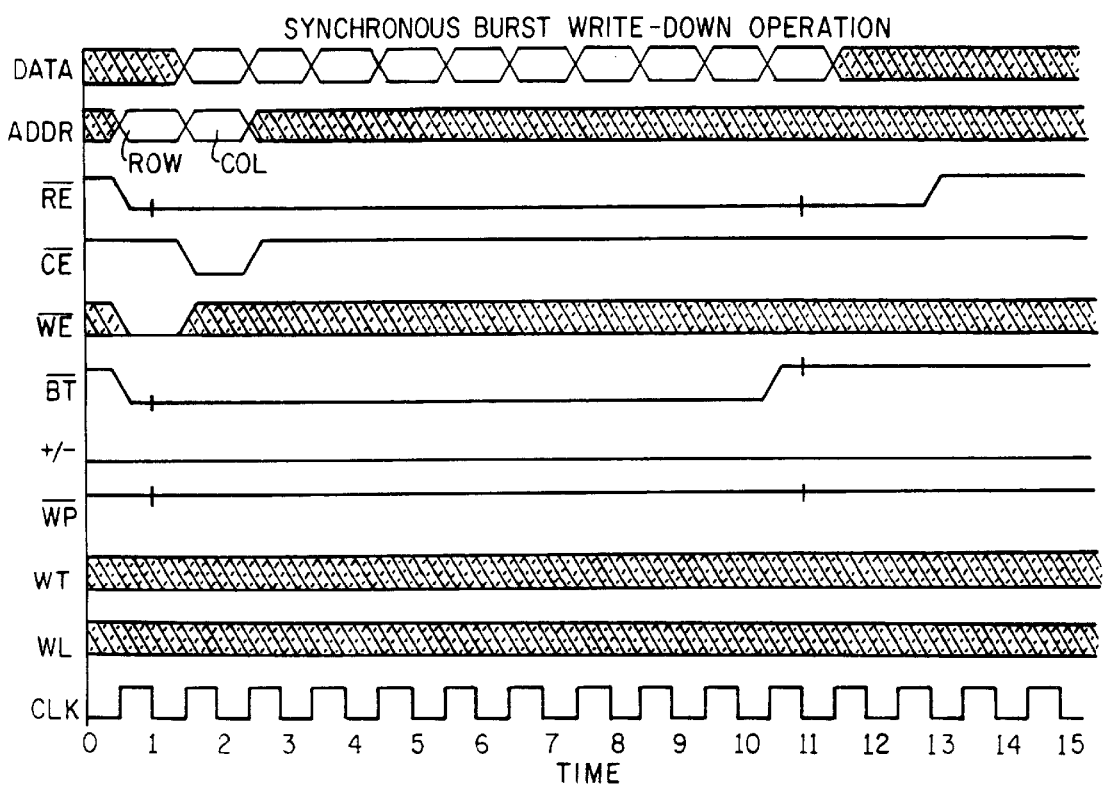
FIG. 13 is a timing diagram of another synchronous burst write-down operation.

FIGS. 12 and 13, respectively, are alternative timing diagrams for synchronous burst write-up and write-down operations of the synchronous random access memory 30 of FIG. 2. The difference in the timing diagrams of FIGS. 12 and 13 with respect to the diagrams of FIGS. 10 and 11 is that the write signal WE is sampled at the clock cycle time 1 instead of at the clock cycle time 2. Either timing is acceptable for adequate operation of the synchronous random access memory 30.

The just described synchronous burst write (either write-up or write-down) operations provide the data processing system of FIG. 1 with a capability to write into a row of the memory array 75 an entire sequence of data bits (a burst) at a rate of one bit per cycle of the system clock CLK for the active duration of the burst signal $\overline{BT}$. A single row address and only the initial column address are forwarded from the digital processor 20 to the synchronous random access memory 30. The rest of the sequence of column addresses is produced by the column address counter circuitry 52 at the rate of one new column address for every cycle of the system clock CLK.

Figures 14, 15:
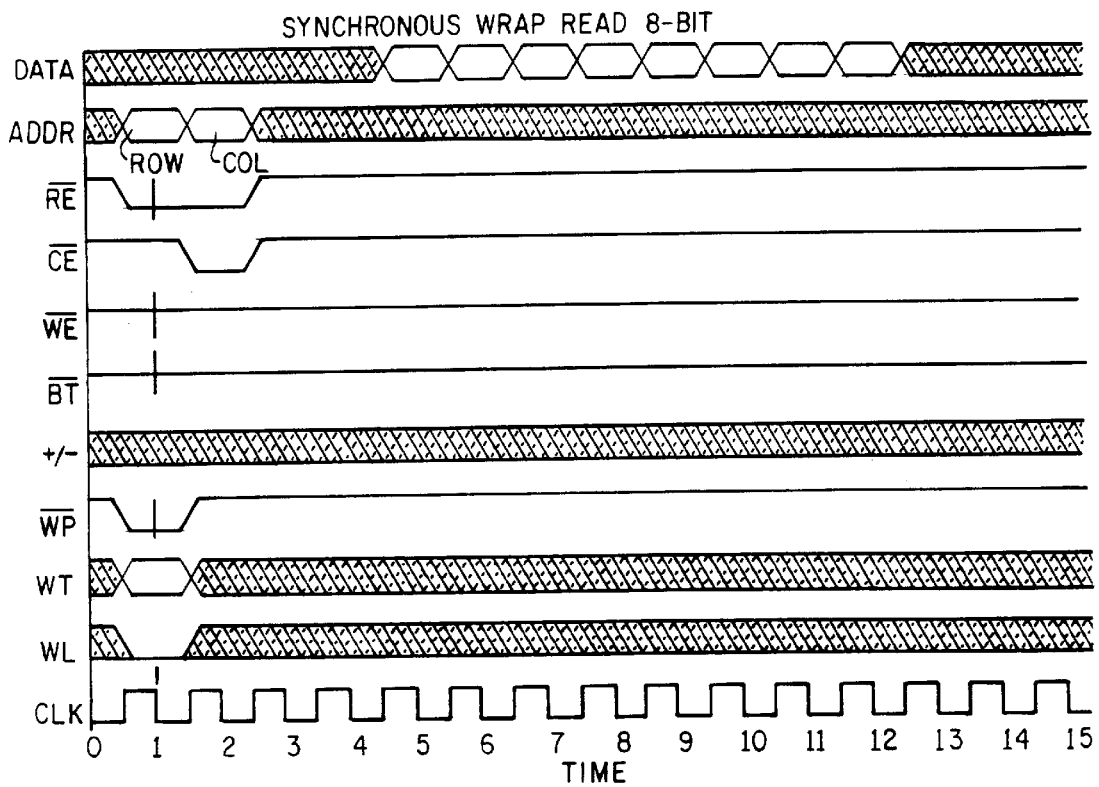
FIG. 14 is a timing diagram of a synchronous wrap read 8-bit operation.
FIG. 15 is a truth table for a wrap address scrambler used in a synchronous wrap read 8-bit operation.

Referring now to FIG. 14, there is shown a timing diagram of a synchronous wrap read 8-bit operation of the synchronous random access memory of FIG. 2. From a row of the memory array 75, eight bits of data are to be read from a single row and from columns selected by the initial column address latched in the upper count section 58 of the column address counter 52. Row addressing and initial column addressing occur as previously described. Gate 53 is enabled by a wrap control signal WRAP during system clock cycle time 1 for transmitting the initial column address to the column address decoder for reading out data from the columns of the memory array 75. Such data is directed through the output multiplexer OMUX in response to a selection made by the least significant bits of the initial column address latched in the lower count section 59 of the column address counter 52, as modified by a subsequent conversion. The least significant bits of the initial column address are converted into a sequence of addresses generated by the wrap address scrambler and multiplexer 61.

FIG. 15 is TABLE I showing the logic of the conversion process that is accomplished by the wrap address scrambler and multiplexer. As shown in TABLE I, the wrap length signal WL is zero (WL=0). Headings for the columns of the table include, as an input, the three least significant bits of the initial column address A0, A1, A2. The wrap type signal WT may be either low (WT=0) or high (WT=1). Each line of the truth table presents a sequence of output addresses which are produced by the wrap address scrambler 61 in response to the three least significant bits from the initial column address residing in the column address counter 52. The wrap address scrambler 61 produces the sequence for which ever wrap type WT is applied in synchronism with the system clock signal CLK.

Thus in the top line for wrap type signal WT equal to zero (WT=0) and initial address A0=0, A1=0, A2=0, the sequence of addresses produced by the wrap address scrambler is 0,1,2,3,4,5,6,7. The translation from the initial input address to the output sequence of address may be accomplished in a number of ways, e.g., by a look-up table. Output addresses from the wrap address scrambler 61 access similarly ordered outputs from the output multiplexer OMUX. Since only eight bits are latched into the output multiplexer, only eight addresses are produced and used for reading those bits to the data bus 25.

If the wrap type signal equals (WT=1), then the sequence of addresses occurs in the order shown in the right most column. Thus when the wrap type signal WT=1 and the least significant three bits of the initial column address are A0=0, A1=1, A2=0, the order of addresses applied to the output multiplexer is 2,3,0,1,6,7,4,5. Bits from output multiplexer positions, so identified, are read out in that order onto the data bus 25 of FIG. 2.

Figures 16, 17:
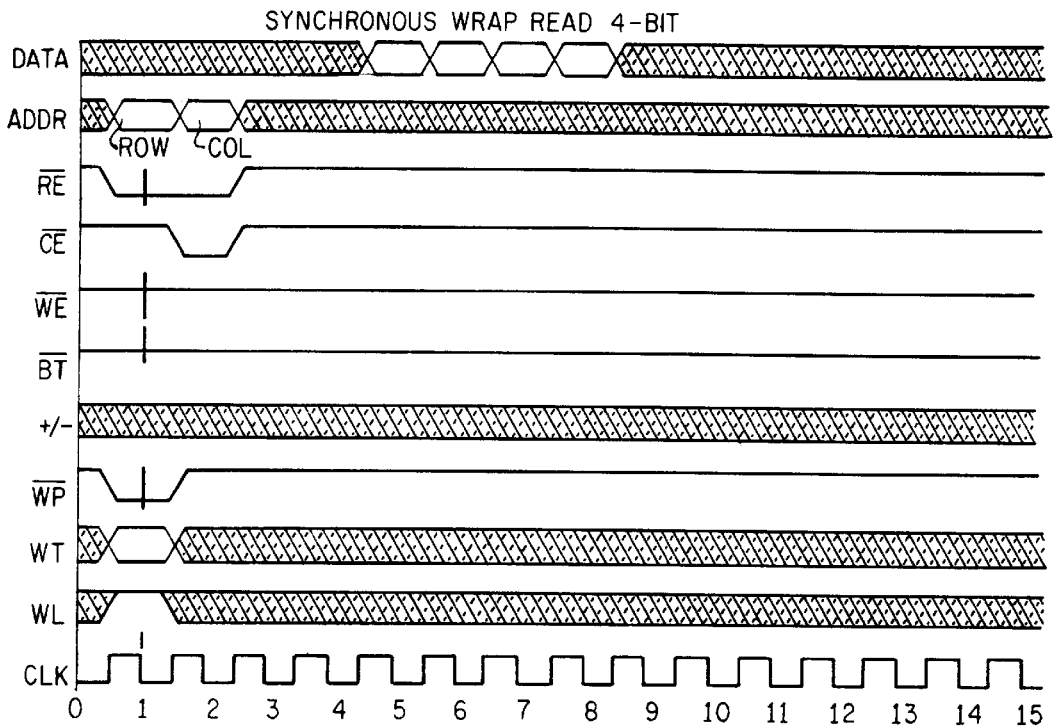
FIG. 16 is a timing diagram of a synchronous wrap read 4-bit operation.
FIG. 17 is a truth table for a wrap address scrambler used in a synchronous wrap read 4-bit operation.

Referring now to FIGS. 16 and 17, there is shown a timing diagram and a truth table for a synchronous wrap read operation that reads out four bits rather than the eight bits read out during the operation represented by FIGS. 14 and 15. For the four bit wrap read operation, the wrap length signal equals (WL=1). Since there are only four bits to be read through the output multiplexer, only the two least significant initial column address bits A0 and A1 are applied to select the order of output. Selection of the wrap type is made by the state of the wrap type signal WT to determine the order of addresses for reading out of the output multiplexer onto the data bus 25. The wrap address scrambler and multiplexer 61 converts the least significant two bits of the initial column address into the desired wrap sequence in accordance with the TABLE II presented in FIG. 17.

The just described synchronous wrap read (either 8-bit or 4-bit) operations provide the data processing system of FIG. 1 with a capability to read from a row of the memory array 75 a group of data bits in an order prescribed by the column address of the first bit accessed. The group of bits is read out at a rate of one bit per cycle of the system clock CLK until the selected eight bits or four bits are read out. A single row address and only the initial column address are forwarded over the address bus from the digital processor 20 to the synchronous random access memory 30. The rest of the group of column addresses is produced by the column address counter circuitry 52 and the wrap address scrambler and multiplexer 61 at a rate of a new column address for every cycle of the system clock CLK.

A similar synchronous wrap write operation is enabled by applying a low active write signal $\overline{WE}$ to commence the operation.

Referring once again to FIG. 6, an initial column address is applied in parallel to and is latched into the stages of the column address counter 52. The burst direction signal +/− is applied to all of the stages to determine whether the count is incremented or decremented in response to each cycle of the clock signal COUNT. The clock signal COUNT also is applied to all stages. Each stage of the column address counter 52 is interconnected with the adjacent stages on both sides. There is a connection path for incrementing the count and a separate path between each pair of adjacent stages for decrementing the count.

Figure 18:
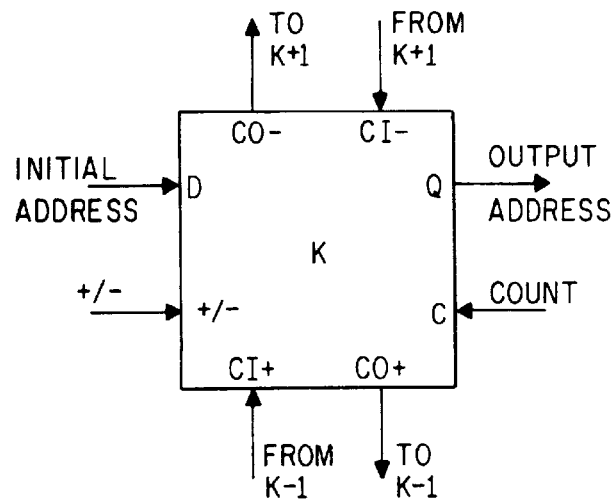
FIG. 18 is a schematic block diagram of a stage for the column address counter of FIG. 17.

FIG. 18 shows one stage K of the column address counter 52 in greater detail. At the top of stage K, there are two terminals that are interconnected with the next higher order stage K+1 of the column address counter 52. Carry-out decrement terminal CO− and carry-in decrement terminal CI− are connected with the adjacent stage K+1. At the bottom of stage K, there are two terminals connected with the next lower order stage K−1. A carry-in increment terminal CI+ and carry out increment terminal CO+ are interconnected with the adjacent stage K−1. The initial address data is applied to the data input terminal D. The burst direction signal +/− is applied to the increment/decrement terminal +/−. The clock signal COUNT is applied to a clock input terminal C, and output addresses (to be forwarded to the memory array 75 and the input and output multiplexers) occur at the output terminal Q.

Referring once again to FIG. 6, the wrap address scrambler 73 has three inputs 74 received from the lower count section 59 of the column address counter 52.

In FIG. 6 for synchronous random access and synchronous burst operations, those three inputs are transmitted directly to three outputs 76, 77 and 78. Outputs 77 and 78 are applied directly to control the input multiplexer IMUX and the output multiplexer OMUX. The output 76 is applied to a multiplexer 74 which for the synchronous burst operation transmits the signal to the input and output multiplexers IMUX and OMUX. For synchronous random access and synchronous burst operations, the least significant bits of the count in the column address counter 52 are applied directly to control the input and output multiplexers.

For synchronous wrap operations, the wrap address scrambler 73 and the multiplexer 74 convert the least significant bits of the column address to the desired sequence of addresses for reading bits from the input and output multiplexers IMUX and OMUX. The wrap length signal WL is active all of the time except for a four bit wrap length. Then the wrap length signal WL cuts off the signal on the lead 76 so that the two leads 77 and 78 apply address bits from the column address counter and the multiplexer 74 applies a zero to the input and output multiplexers IMUX and OMUX. The wrap address scrambler produces the desired sequences of bits on the leads 77 and 78, in accordance with TABLES I and II.

In FIG. 2, the mask register 93 receives and stores coded mask data from the data bus 25. Responsive to the system clock signal CLK, the mask register 93 applies the mask data to control the operation of the count control circuit 94.

Count control circuit 94, in response to the status of the burst control signal BURST, the wrap control signal WRAP, the mask data, and the system clock CLK, produces the clock signal COUNT for controlling the operation of the column address counter 52 and the wrap address scrambler and multiplexer 61.

Timing and control circuit 42 of FIG. 2 is responsive to the row address control signal $\overline{RE}$, the column address control signal $\overline{CE}$, the write signal $\overline{WE}$, the burst signal $\overline{BT}$, the burst direction signal +/−, the wrap select signal $\overline{WP}$, the wrap-type signal WT, the wrap-length signal WL, and the system clock signal CLK for producing control signals, such as, the row and column address latching signals XAL and YAL, the latch initial address signal LIA, the write enable signal WEN, the data-in latch signal DINL, the burst control signal BURST, and the wrap control signal WRAP.

In the timing and control circuit 42 of FIG. 2, all of the signals from the control bus 60 are gated by the system clock signal CLK on lead 67 so that all control signals internal to the synchronous random access memory 30, such as, the signals XAL, YAL, LIA, WEN, DINL, BURST and WRAP are synchronized with the system clock signal CLK. This feature assures that the functions of the synchronous random access are synchronized with that clock. Any logic circuitry external to the synchronous random access memory 30 need not be concerned with any complex timing relationships between the various signals transmitted on the control bus 60.

Figure 19:
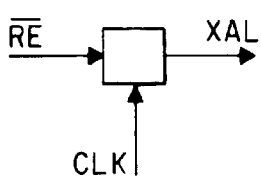
FIG. 19 is a logic schematic diagram of a timing gate circuit.

Referring now to FIG. 19, there is shown an exemplary gate 101 of the timing and control circuit 42 of FIG. 2. In FIG. 19, the row address control signal $\overline{RE}$ is gated by the system clock signal CLK, i.e., sampled on the negative-going edge of the pulses of the system clock CLK. The resulting output of the gate 101 is the row address latch signal XAL.

Figure 20:
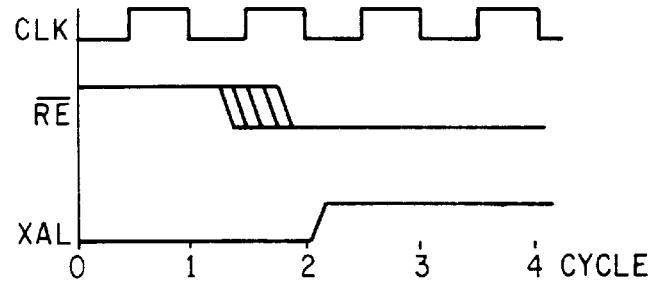
FIG. 20 is a timing diagram for the operation of the gate circuit of FIG. 19.

FIG. 20 is a timing diagram for the operation of the gate 101. As shown in FIG. 20, the output row address latch signal XAL is activated by the negative-going edge of the system clock CLK at the system clock cycle time 2 when the row address control signal $\overline{RE}$ is low. The timing of the negative-going edge of the row address control signal $\overline{RE}$ is irrelevant, as long as the level of that signal is low at the negative-going edge of the system clock signal CLK.

Similarly, all of the other internal control signals are responsive to sampled levels of the external control signals on the control bus 60 at times of the negative-going edges of the system clock signal CLK.

Figure 21:
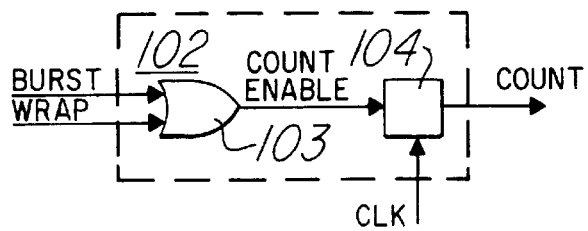
FIG. 21 is a logic schematic diagram for another timing gate circuit.

Referring now to FIG. 21, there is shown an exemplary circuit 102 which is responsive to the burst control signal BURST, the wrap control signal WRAP, and the system clock signal within the count control block 94 of FIG. 2 CLK, for producing the count clock signal COUNT. In FIG. 21, the active high signals BURST and WRAP are applied as inputs to an OR gate 103 to produce a signal COUNT ENABLE for gating the system clock signal. A gate 104 is enabled for transmitting the system clock signal CLK when either the burst control signal BURST or the wrap control signal WRAP is active high.

The timing and control circuit 42 of FIG. 2 produces the burst control signal BURST and wrap control signal WRAP. The burst control signal BURST and the wrap control signal WRAP are normally low and go high active. The initial edges of the burst control signal BURST and the wrap control signal WRAP are aligned with negative-going edges of the system clock signal CLK. Once the burst control signal BURST and the wrap control signal WRAP are activated, they remain active for the duration of their respective operations.

The count clock signal COUNT is a clock pulse sequence synchronized with the system clock CLK and lasting while either the signal BURST or the signal WRAP is active. Pulses of the count clock signal COUNT either increment or decrement the column address residing in the column address counter 52 depending upon the state of the burst direction signal +/−.

Figure 22:
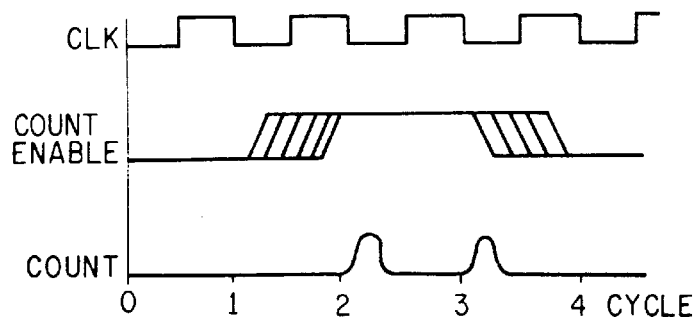
FIG. 22 is a timing diagram for the operation of the gate circuit of FIG. 20.

Referring now to FIG. 22, the timing diagram shows an exemplary operation of the count signal gate arrangement 102 of FIG. 21. The internal control signal COUNT ENABLE goes high active before the system clock cycle time 2 and stays high active until after the system clock cycle time 3. As a result of gating the system clock signal CLK through the gate 104 of FIG. 21 under control of the control signal COUNT ENABLE, the resulting count clock signal COUNT is gated to produce pulses at cycle times 2 and 3 in synchronism with the system clock signal CLK.

Figure 23:
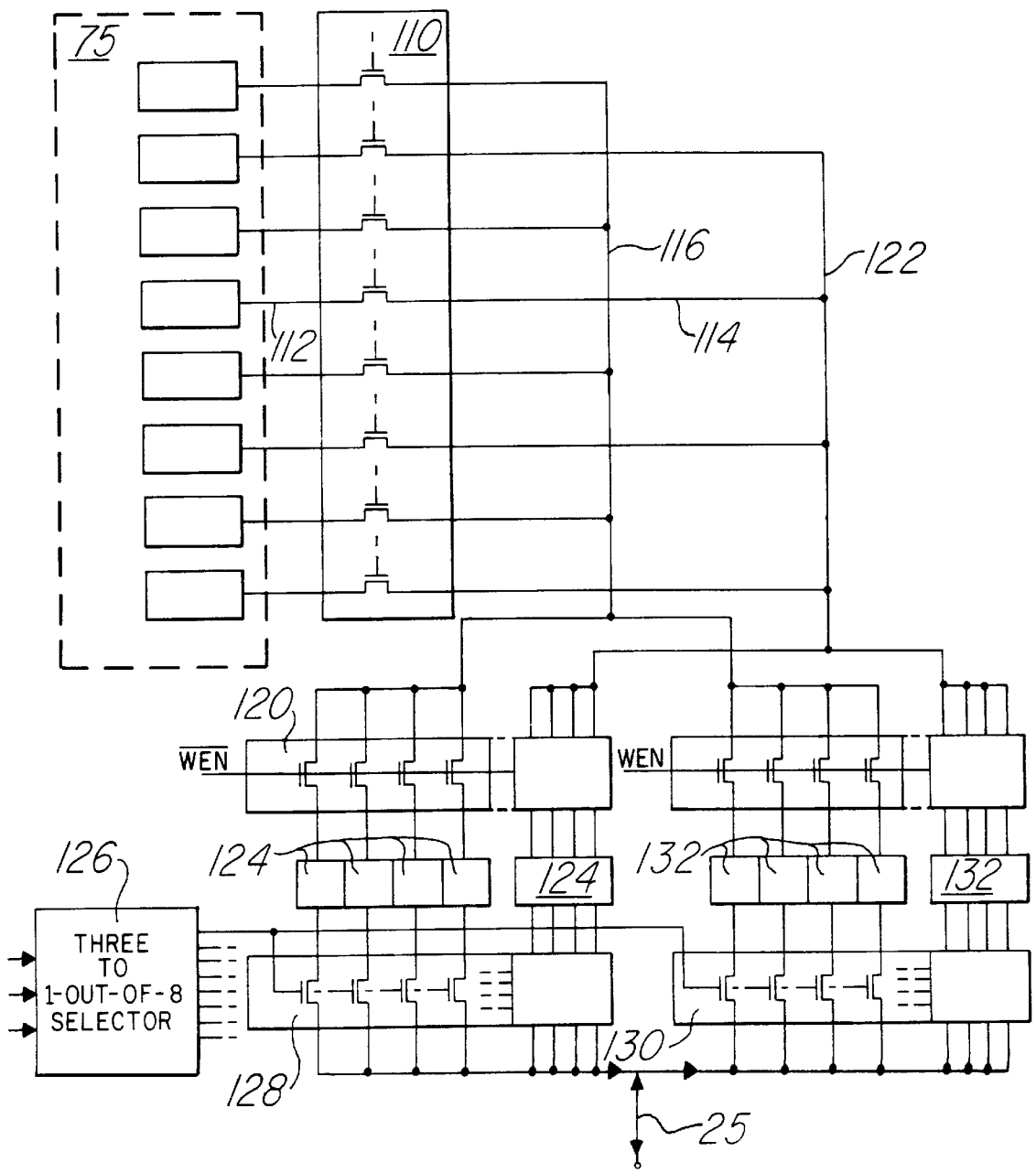
FIG. 23 is a block diagram of an input multiplexer and an output multiplexer arrangement for the synchronous memory of FIG. 2.

Referring now to FIG. 23, there is shown a block diagram of the output multiplexer OMUX and the input multiplexer IMUX arranged with selection and gating circuits for controlling transfer of data bits read out from the memory array 75 to the data bus 25 and for controlling transfer of data bits to be written from the data bus 25 to the memory array 75.

With respect to FIG. 23, the column address decoder 54 of FIG. 2 selects two blocks of four columns by enabling two gates in block gating circuit 110. Each lead into and out of the block gating circuit represents four leads for a block of data. Every other block of data, i.e., the even order blocks, is connected by way of an even order bus 116 to an output enable gate 120, which includes a separate gate for each bit lead and is operated by the complement of the write enable signal WEN. Odd order blocks from the memory array 75 are connected by way of an odd order bus 122 also to the output enable gate 120. The output enable gate 120 is connected to eight separate output registers 124 for storing individual data bits read out from the memory array 75.

In FIG. 23, converter circuit 126 converts the three least significant bits of the column address from the wrap address scrambler and multiplexer 61 into a one-out-of-eight selection code, which is applied to an output transfer selection gate circuit 128. For each of the eight output registers 124, there is an output transfer selection gate controlled by a separate one of the one-out-of-eight selection code, which is applied to control the output transfer selection gate circuit 128. The output transfer selection gates 128 are operated one at a time to allow a data bit to be transmitted from its output register to the data bus 25 in synchronism with the system clock.

Continuing to refer to FIG. 23, for burst read-up operation of the input and output multiplexers, the column address in the column address counter 52 of FIG. 2 is incremented in response to the clock signal COUNT. Every fourth cycle of the clock signal COUNT, the two column address decoder output signals step up one order of sets, e.g., from n and n+1 to n+1 and n+2. This disables one of two previously open gates and enables one previously open gate and a new gate 110. Data bits stored in four of the output registers 124 thereby are changed to a new block of data to be read out to the data bus 25. Thus, the set of four of the output registers 124 exhausted of data is replenished with new data because the next higher order set of column addresses from the memory array 75 is enabled to transfer data into the exhausted output registers 124.

With respect to FIG. 23 for a burst read-down operation, the output multiplexer OMUX operates, as just described, except that the order of addresses applied to the column address decoder 54 is decrementing. Thus every fourth cycle of the clock signal COUNT, the two enabled blocks of data are the two next lower order blocks of data, e.g., from column sets n and n−1 to n−1 and n−2.

Further with respect to FIG. 23 for a wrap read operation, the output multiplexer OMUX operates similar to the previously described burst read-up operation until the initial address selection is completed. Eight data bits are read out of the memory array and are latched into the eight output register circuits 124. Thereafter their order of readout to the data bus 25 is determined by two factors. The first and second factors are the wrap length signal WL and the wrap type signal WT. As previously mentioned, combinations of those two signals WL and WT cause the wrap address scrambler 73 of FIG. 6 to produce a series of enabling signal codes for the output gates 128 of the output multiplexer OMUX. In response to that series of enabling signal codes, corresponding bits from the output registers 124 are read out through the output transfer selection gates 128 in the selected order onto the data bus 25.

In FIG. 23, a somewhat similar arrangement is provided in the input multiplexer IMUX for writing data from the data bus 25 into the memory array 75. Input transfer selection gates 130 are selectively enabled by the one-out-of-eight code from the wrap address scrambler and multiplexer 61. The bits are stored in separate input register circuits 132. The stored data bits are transferred in blocks of four bits to even and odd order blocks of columns of the memory array 75 as the upper count portion of the column address is either incremented or decremented in response to the clock signal COUNT.

Figure 24:
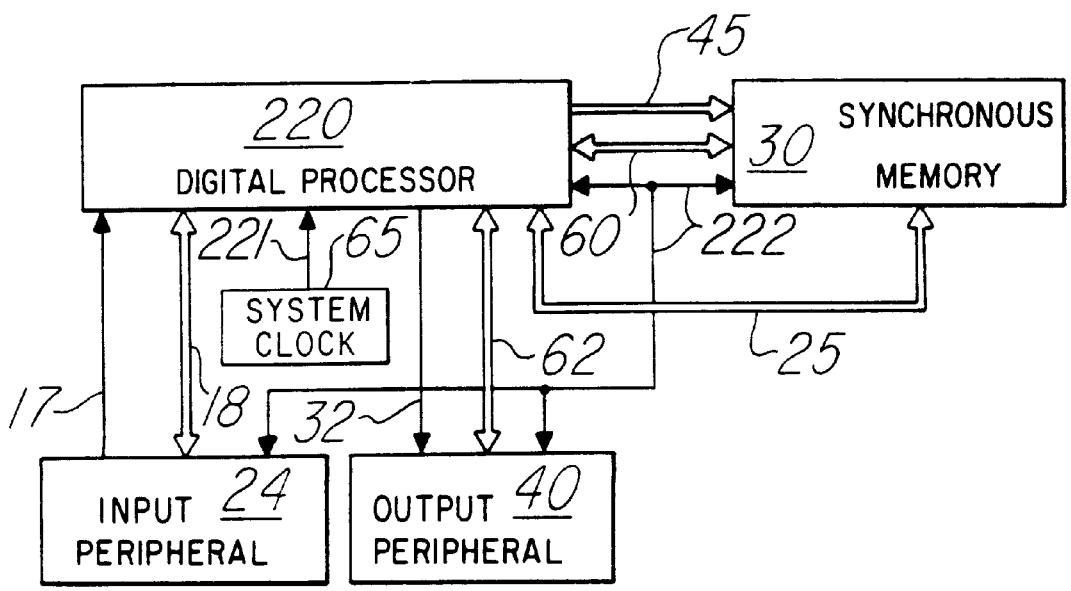
FIG. 24 is a block diagram of an alternative data processing system including a synchronous random access memory.

Referring now to FIG. 24, there is shown a data processing system 215 including a digital processor 220, which is similar to the data processing system 15 of FIG. 1 except that the system clock 65 produces a clock signal that is applied over a lead 221 to the digital processor 220. Within the digital processor 220, the clock signal is gated or otherwise manipulated into a processor clock signal that is applied by way of a lead 222 to the synchronous memory 30, the input peripheral device 24, and the output peripheral device 40. Otherwise the data processing system 215 operates like the data processing system 15 which was described with respect to FIGS. 1 and 2.

The foregoing describes some data processing system arrangements which represent illustrative embodiments of the invention. Those embodiments and others made obvious in view thereof are considered to fall within the scope of the appended claims.

What is claimed is:

1. A synchronous random access memory comprising:
    a timing and control circuit for receiving a system dock signal and producing a first address control signal, the system clock signal having a sequence of clock cycles, each clock cycle having positive-going and negative-going edges;
    an addressing circuit for latching the first address signal, responsive to the first address control signal and the system clock signal; and an output circuit for producing a predetermined number of data bits from the storage cells, wherein the output circuit produces a first data bit, responsive to the positive-going edge of the system clock signal, and a second data bit, responsive to the negative-going edge of the system clock signal.

2. A synchronous random access memory as in claim 1, wherein the storage cells are dynamic storage cells.

3. A synchronous random access memory, as in claim 2, wherein the predetermined number of data bits is 4.

4. A synchronous random access memory, as in claim 2, wherein the predetermined number of data bits is 8.

5. A synchronous random access memory as in claim 2, wherein the addressing circuit further comprises:
 a row decoding circuit for selecting a row of storage cells, responsive to the first address signal;
 an address counter circuit for receiving a second address signal, the address counter circuit producing an output address signal, responsive to the system clock signal; and
 a column decoding circuit for selecting a column of storage cells from the row of storage cells, responsive to the output address signal.

6. A synchronous random access memory as in claim 5, wherein the addressing circuit latches the second address signal, responsive to a second address control signal and the system clock signal.

7. A synchronous random access memory as in claim 6, wherein the output circuit farther comprises a multiplex circuit coupled to receive the first data bit and the second data bit, the multiplex circuit producing the first data bit, responsive to the positive-going edge of the system clock signal, and the second data bit, responsive to the negative-going edge of the system clock signal, at a data terminal.

8. A synchronous random access memory as in claim 6, wherein the timing and control circuit further determines an order of the predetermined number of data bits in response to a data control signal.

9. A synchronous random access memory as in claim 8, wherein the order of the predetermined number of data bits is by sequential column address.

10. A synchronous random access memory as in claim 8, wherein the order of the predetermined number of data bits is by interleaved wrap sequence.

11. A data processing system as in claim 8, wherein the first address control signal is produced in response to a row enable signal, and the second address control signal is produced in response to a column enable signal.

12. A synchronous random access memory as in claim 8, wherein the output circuit produces two data bits from the predetermined number of data bits at a data terminal for each clock cycle of the sequence of clock cycles.

13. A synchronous random access memory as in claim 1, wherein the first address signal includes a first and a second group of address bits.

14. A synchronous random access memory as in claim 13, wherein the addressing circuit further comprises:
 a row decoding circuit for selecting a row of storage cells, responsive to the first group of address bits;
 an address counter circuit for receiving the second group of address bits, the address counter circuit producing an output address signal, responsive to the system clock signal; and
 a column decoding circuit for selecting a column of storage cells from the row of storage cells, responsive to the output address signal.

15. A synchronous random access memory as in claim 14, wherein the address counter circuit produces the output address signal by incrementing the second group of address bits.

16. A synchronous random access memory, as in claim 14, wherein the predetermined number of data bits is 4.

17. A synchronous random access memory, as in claim 14, wherein the predetermined number of data bits is 8.

18. A synchronous random access memory as in claim 14, wherein the timing and control circuit further determines an order of the predetermined number of data bits in response to a data control signal.

19. A synchronous random access memory as in claim 18, wherein the order of the predetermined number of data bits is by sequential column address.

20. A synchronous random access memory as in claim 18, wherein the order of the predetermined number of data bits is by interleaved wrap sequence.

21. A synchronous random access memory as in claim 18, wherein the output circuit further comprises a multiplex circuit coupled to receive the first data bit and the second data bit, the multiplex circuit producing the first data bit, responsive to the positive-going edge of the system clock signal, and the second data bit, responsive to the negative-going edge of the system dock signal, at a data terminal.

22. A synchronous random access memory as in claim 18, wherein the storage cells are static storage cells.

23. A synchronous random access memory comprising:
 a timing and control circuit for receiving a system clock signal and producing a first address control signal, the system clock signal having a sequence of dock cycles, each clock cycle having positive-going and negative-going edges;
 an addressing circuit for latching the first address signal, responsive to the first address control signal and the system clock signal; and
 an output circuit for producing a plurality of data bits from the storage cells, the data bits having an order wherein the output circuit produces a first data bit, responsive to the positive-going edge of the system clock signal, and a second data bit, responsive to the negative-going edge of the system dock signal.

24. A synchronous random access memory as in claim 23, wherein the storage cells are dynamic storage cells.

25. A synchronous random access memory as in claim 24, wherein the order of the plurality of data bits is by sequential column address.

26. A synchronous random access memory as in claim 24, wherein the order of the plurality of data bits is by interleaved wrap sequence.

27. A synchronous random access memory as in claim 24, wherein the addressing circuit further comprises:
 a row decoding circuit for selecting a row of storage cells, responsive to the first address signal;
 an address counter circuit for receiving a second address signal, the address counter circuit producing an output address signal, responsive to the system dock signal; and
 a column decoding circuit for selecting a column of storage cells from the row of storage cells, responsive to the output address signal.

28. A synchronous random access memory as in claim 27, wherein the addressing circuit latches the second address signal, responsive to a second address control signal and the system clock signal.

29. A synchronous random access memory as in claim 28, wherein the output circuit further comprises a multiplex circuit coupled to receive the first data bit and the second data bit, the multiplex circuit producing the first data bit, responsive to the positive-going edge of the system clock signal, and the second data bit, responsive to the negative-going edge of the system clock signal at a data terminal.

30. A synchronous random access memory as in claim 28, wherein the first address control signal is produced in response to a row enable signal and the system clock signal, and the second address control signal is produced in response to a column enable signal and the system clock signal.

31. A synchronous random access memory as in claim 28, wherein the output circuit produces two data bits from the plurality of data bits at a data terminal for each clock cycle of the sequence of clock cycles.

32. A synchronous random access memory as in claim 23, wherein the first address signal includes a first and a second group of address bits.

33. A synchronous random access memory as in claim 32, wherein the addressing circuit further comprises:
- a row decoding circuit for selecting a row of storage cells, responsive to the first group of address bits;
- an address counter circuit for receiving the second group of address bits, the address counter circuit producing an output address signal, responsive to the system clock signal; and
- a column decoding circuit for selecting a column of storage cells from the row of storage cells, responsive to the output address signal.

34. A synchronous random access memory as in claim 33, wherein the address counter circuit produces the output address signal by incrementing the second group of address bits.

35. A synchronous random access memory as in claim 33, wherein the order of the plurality of data bits is by sequential column address.

36. A synchronous random access memory as in claim 33, wherein the order of the plurality of data bits is by interleaved wrap sequence.

37. A synchronous random access memory as in claim 33, wherein the output circuit further comprises a multiplex circuit coupled to receive the first data bit and the second data bit, the multiplex circuit producing the first data bit, responsive to the positive-going edge of the system clock signal, and the second data bit, responsive to the negative-going edge of the system dock signal at a data terminal.

38. A synchronous random access memory as in claim 33, wherein the storage cells are static storage cells.

39. A synchronous dynamic random access memory comprising:
- an array of dynamic storage cells arranged in rows and columns;
- a timing and control circuit for receiving a system clock signal having a plurality of periodic clock cycles, each periodic clock cycle having a positive-going edge and a negative-going edge, the timing and control circuit producing a first address control signal, responsive to a first clock cycle of the plurality of periodic clock cycles, and a second address control signal, responsive to a second clock cycle of the plurality of periodic clock cycles;
- a row address circuit for receiving a first address signal for accessing a row of dynamic storage cells, responsive to the first address control signal and the first clock cycle;
- a column address circuit for receiving a second address signal for accessing at least one column of dynamic storage cells, responsive to the second address control signal and the second clock cycle; and
- an output circuit for producing a plurality of data bits from the storage cells, wherein the output circuit produces a first data bit, responsive to the positive-going edge of the system clock signal, and a second data bit, responsive to the negative-going edge of the system clock signal.

40. A synchronous dynamic random access memory as in claim 39, wherein the column addressing circuit further comprises:
- an address counter circuit for receiving the second address signal, the address counter circuit producing an output address signal, responsive to the system dock signal; and
- a column decoding circuit for selecting the column of storage cells from the row of storage cells, responsive to the output address signal.

41. A synchronous dynamic random access memory as in claim 40, wherein the address counter circuit produces the output address signal by incrementing the second address signal, responsive to the system dock signal.

42. A synchronous dynamic random access memory as in claim 40, wherein the column address circuit latches the second address signal, responsive to the second address control signal.

43. A synchronous dynamic random access memory as in claim 40, wherein the timing and control circuit further produces a first data control signal for selecting a predetermined number of the plurality of data bits.

44. A synchronous dynamic random access memory, as in claim 43, wherein the predetermined number of the plurality of data bits is 4.

45. A synchronous dynamic random access memory, as in claim 43, wherein the predetermined number of the plurality of data bits is 8.

46. A synchronous dynamic random access memory as in claim 43, wherein the timing and control circuit further produces a second data control signal for selecting an order of the plurality of data bits.

47. A synchronous dynamic random access memory as in claim 46, wherein the order of the predetermined number of data bits is by sequential column address.

48. A synchronous dynamic random access memory as in claim 46, wherein the order of the predetermined number of data bits is by interleaved wrap sequence.

49. A synchronous dynamic random access memory as in claim 46, wherein the output circuit further comprises a multiplex circuit coupled to receive the first data bit and the second data bit, the multiplex circuit producing the first data bit, responsive to the positive-going edge of the system clock signal, and the second data bit, responsive to the negative-going edge of the system clock signal at a data terminal.

50. A synchronous dynamic random access memory as in claim 39, wherein the column addressing circuit further comprises:
- an address counter circuit for receiving a third address signal, the address counter circuit producing an output address signal, responsive to the system clock signal;
- a first column decode circuit for selecting the at least one column of dynamic storage cells, responsive to the second address signal and one clock cycle of the periodic clock cycles, for producing the plurality of data bits; and
- a second column decode circuit for sequentially producing the plurality of data bits, responsive to the output address signal.

51. A synchronous dynamic random access memory as in claim 50, wherein the address counter circuit produces the output address signal by incrementing the third address signal, responsive to the system clock signal.

52. A synchronous dynamic random access memory as in claim 50, wherein the column address circuit latches the second address signal, responsive to the second address control signal.

53. A synchronous dynamic random access memory as in claim 50, wherein the timing and control circuit further produces a first data control signal for selecting a predetermined number of the plurality of data bits.

54. A synchronous dynamic random access memory, as in claim 53, wherein the predetermined number of the plurality of data bits is 4.

55. A synchronous dynamic random access memory, as in claim 53, wherein the predetermined number of the plurality of data bits is 8.

56. A synchronous dynamic random access memory as in claim 53, wherein the timing and control circuit further produces a second data control signal for selecting an order of the plurality of data bits.

57. A synchronous dynamic random access memory as in claim 56, wherein the order of the predetermined number of data bits is by sequential column address.

58. A synchronous dynamic random access memory as in claim 56, wherein the order of the predetermined number of data bits is by interleaved wrap sequence.

59. A synchronous dynamic random access memory as in claim 56, wherein the output circuit further comprises a multiplex circuit coupled to receive the first data bit and the second data bit, the multiplex circuit producing the first data bit, responsive to the positive-going edge of the system clock signal, and the second data bit, responsive to the negative-going edge of the system clock signal at a data terminal.

* * * * *

UNITED STATES PATENT AND TRADEMARK OFFICE
CERTIFICATE OF CORRECTION

PATENT NO. : 5,982,694
DATED : November 9, 1999
INVENTOR(S) : Vogley, et. al.

It is certified that error appears in the above-identified patent and that said Letters Patent is hereby corrected as shown below:

Column 14, line 65, change "latching the first" to --latching a first--.

Column 15, line 2, change "the storage cells" to --plural storage cells--.

Column 16, line 34, change "latching the first" to --latching a first--.

Column 16, line 38, change "the storage cells" to --plural storage cells--.

Signed and Sealed this

Fourth Day of July, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO. : 5,982,694
DATED : November 9, 1999
INVENTOR(S) : Vogley et al.

It is certified that error appears in the above-identified patent and that said Letters Patent is hereby corrected as shown below:

Title page,
Item [63], Related U.S. Application Data, after "5,587,954" insert -- , which is a division of Ser. No. 08/184,749, Jan. 21, 1994, Pat. No. 5,390,149, which is a continuation of Ser. No. 690,207, Apr. 23, 1991, now abandoned. --.

Column 14,
Line 65, change "latching the first" to -- latching a first --.

Column 15,
Line 2, change "the storage cells" to -- plural storage cells --.

Column 16,
Line 34, change "latching the first" to -- latching a first --.
Line 38, change "the storage cells" to -- plural storage cells --.

Signed and Sealed this

Thirteenth Day of December, 2005

JON W. DUDAS
*Director of the United States Patent and Trademark Office*